US012804903B2

(12) United States Patent

Zhou et al.

(10) Patent No.: US 12,804,903 B2

(45) Date of Patent: Nov. 17, 2026

(54) MEMORY DEVICE INCLUDING A GERMANIUM-CONTAINING SOURCE STRUCTURE AND METHODS FOR FORMING THE SAME

(71) Applicant: Sandisk Technologies, Inc., Milpitas, CA (US)

(72) Inventors: Fei Zhou, San Jose, CA (US); Kartik Sondhi, Milpitas, CA (US); Senaka Kanakamedala, San Jose, CA (US)

(73) Assignee: Sandisk Technolgies, Inc., Milpitas, CA (US)

( * ) Notice: Subject to any disclaimer, the term of this patent is extended or adjusted under 35 U.S.C. 154(b) by 300 days.

(21) Appl. No.: 18/433,971

(22) Filed: Feb. 6, 2024

(65) Prior Publication Data

US 2025/0254872 A1 Aug. 7, 2025

(51) Int. Cl.

*H10B 43/27* (2023.01)
*H10B 80/00* (2023.01)
(Continued)

(52) U.S. Cl.

CPC ............. *H10B 43/27* (2023.02); *H10B 80/00* (2023.02); *H10W 90/00* (2026.01);
(Continued)

(58) Field of Classification Search

CPC ....... H10B 43/27; H10B 80/00; H10W 90/00; H10W 80/211; H10W 80/312
See application file for complete search history.

(56) References Cited

U.S. PATENT DOCUMENTS 9,449,981 B2 9/2016 Pachamuthu et al.
9,478,495 B1 * 10/2016 Pachamuthu .......... H10B 41/10
(Continued)

FOREIGN PATENT DOCUMENTS

CN 117581366 A * 2/2024
CN 120693982 A * 9/2025 ............. H10B 43/10
(Continued)

OTHER PUBLICATIONS

Endoh et al., "Novel Ultra High-Density Memory with a Stacked-Surrounding Gate Transistor (S-SGT) Structured Cell," IEDM Proc. (2001) 33-36; https://doi.org/10.1109/IEDM.2001.979396.
(Continued)

*Primary Examiner* — Laura M Menz
(74) *Attorney, Agent, or Firm* — THE MARBURY LAW GROUP PLLC

(57) ABSTRACT

A memory device includes a polycrystalline germanium-containing semiconductor source line layer containing germanium at an atomic percentage greater than 50%, an alternating stack of insulating layers and electrically conductive layers located over the polycrystalline germanium-containing semiconductor source line layer, a memory opening vertically extending through the alternating stack, a memory opening fill structure located in the memory opening and including a memory film and a vertical semiconductor channel having an end surface in electrical contact with the polycrystalline germanium-containing semiconductor source line layer, and an interfacial metal alloy layer located between the polycrystalline germanium-containing semiconductor source line layer and a bottommost insulating layer within the alternating stack.

10 Claims, 34 Drawing Sheets

(51) Int. Cl.
*H10W 90/00* (2026.01)
*H10W 80/00* (2026.01)

(52) U.S. Cl.
CPC ........ *H10W 80/211* (2026.01); *H10W 80/312* (2026.01); *H10W 80/327* (2026.01); *H10W 90/792* (2026.01)

(56) References Cited

U.S. PATENT DOCUMENTS

| | | | | |
|---|---|---|---|---|
| 9,627,395 | B2 * | 4/2017 | Zhang | H10B 41/27 |
| 10,381,362 | B1 * | 8/2019 | Cui | H10B 41/27 |
| 10,629,613 | B1 * | 4/2020 | Shimizu | H10B 43/10 |
| 10,629,616 | B1 | 4/2020 | Kai et al. | |
| 10,665,580 | B1 * | 5/2020 | Hosoda | G11C 16/08 |
| 10,679,847 | B2 * | 6/2020 | Hekmatshoartabari | H10D 30/0227 |
| 10,763,271 | B2 | 9/2020 | Rabkin et al. | |
| 10,868,025 | B2 * | 12/2020 | Zhou | H10B 41/27 |
| 11,195,781 | B2 | 12/2021 | Okina et al. | |
| 11,201,107 | B2 * | 12/2021 | Okina | H10B 43/27 |
| 11,355,486 | B2 | 6/2022 | Mizutani et al. | |
| 11,393,836 | B2 | 7/2022 | Tsutsumi et al. | |
| 11,482,539 | B2 | 10/2022 | Sharangpani et al. | |
| 11,508,711 | B2 | 11/2022 | Ninomiya et al. | |
| 11,521,984 | B2 * | 12/2022 | Sharangpani | H10B 41/27 |
| 11,626,415 | B2 | 4/2023 | Tomita et al. | |
| 11,631,690 | B2 | 4/2023 | Okina et al. | |
| 12,133,388 | B2 * | 10/2024 | Funayama | H10B 43/27 |
| 12,272,616 | B2 * | 4/2025 | Yu | H10D 30/6735 |
| 2004/0155317 | A1 | 8/2004 | Bhattacharyya | |
| 2007/0029607 | A1 | 2/2007 | Kouznetzov | |
| 2013/0270560 | A1 * | 10/2013 | Cheng | H10D 30/024 257/66 |
| 2017/0110336 | A1 * | 4/2017 | Hsu | H10P 50/283 |
| 2018/0269229 | A1 * | 9/2018 | Or-Bach | B82Y 10/00 |
| 2019/0148286 | A1 | 5/2019 | Or-Bach et al. | |
| 2020/0006364 | A1 * | 1/2020 | Rabkin | H10B 41/35 |
| 2020/0194416 | A1 * | 6/2020 | Or-Bach | H10B 20/25 |
| 2020/0258817 | A1 | 8/2020 | Okina et al. | |
| 2020/0335487 | A1 * | 10/2020 | Rajashekhar | H10B 41/27 |
| 2020/0335516 | A1 | 10/2020 | Rajashekhar et al. | |
| 2021/0035965 | A1 | 2/2021 | Mizutani et al. | |
| 2021/0082865 | A1 | 3/2021 | Baraskar et al. | |
| 2021/0091063 | A1 * | 3/2021 | Ninomiya | H10B 41/10 |
| 2021/0151450 | A1 * | 5/2021 | Or-Bach | G11C 11/5628 |
| 2021/0159167 | A1 * | 5/2021 | Tsutsumi | H10B 41/10 |
| 2021/0210503 | A1 * | 7/2021 | Matsuno | H10B 41/27 |
| 2021/0408031 | A1 * | 12/2021 | Sharangpani | H10B 41/35 |
| 2021/0408033 | A1 * | 12/2021 | Baraskar | H10B 41/27 |
| 2022/0051979 | A1 * | 2/2022 | Kuroko | H10B 41/27 |
| 2022/0093644 | A1 * | 3/2022 | Sharangpani | H10D 30/6891 |
| 2022/0130853 | A1 * | 4/2022 | Sharangpani | H10B 41/27 |
| 2022/0157841 | A1 | 5/2022 | Tsutsumi et al. | |
| 2022/0157842 | A1 * | 5/2022 | Tsutsumi | H10B 43/35 |
| 2022/0189984 | A1 | 6/2022 | Okina | |
| 2022/0216145 | A1 * | 7/2022 | Tsutsumi | H10B 41/10 |
| 2023/0041344 | A1 | 2/2023 | Or-Bach et al. | |
| 2023/0128682 | A1 * | 4/2023 | Sondhi | G11C 16/0483 257/314 |
| 2023/0171957 | A1 * | 6/2023 | Zhou | H10B 41/27 257/314 |
| 2023/0187307 | A1 * | 6/2023 | Yu | H10D 30/6735 257/213 |
| 2023/0328973 | A1 * | 10/2023 | Said | H10B 41/10 257/314 |
| 2023/0345719 | A1 * | 10/2023 | Sondhi | H10B 43/27 |
| 2023/0354608 | A1 * | 11/2023 | Nagahata | G11C 16/0483 |
| 2024/0079341 | A1 * | 3/2024 | Kato | G03F 7/0002 |
| 2024/0349500 | A1 * | 10/2024 | Zhou | H10B 41/27 |
| 2025/0040139 | A1 * | 1/2025 | Zhou | G11C 16/0483 |
| 2025/0201659 | A1 * | 6/2025 | Yu | H10D 30/6735 |
| 2025/0254872 | A1 * | 8/2025 | Zhou | H10B 43/27 |
| 2026/0113938 | A1 * | 4/2026 | Minagawa | H10B 41/10 |
| 2026/0181895 | A1 * | 6/2026 | Saito | H10B 43/27 |

FOREIGN PATENT DOCUMENTS

| | | | | | |
|---|---|---|---|---|---|
| CN | 121942312 | A | * | 4/2026 | H10B 43/35 |
| KR | 20230163527 | A | * | 11/2023 | H10W 90/00 |
| WO | WO 2020147119 | A1 | | 7/2020 | |
| WO | WO-2021262249 | A1 | * | 12/2021 | H10W 10/181 |
| WO | WO-2022159141 | A1 | * | 7/2022 | H10W 80/00 |
| WO | WO-2023225155 | A1 | * | 11/2023 | H10W 20/481 |
| WO | WO-2024123438 | A1 | * | 6/2024 | H10B 43/10 |
| WO | WO-2025005997 | A1 | * | 1/2025 | H10B 43/10 |
| WO | WO-2025170654 | A1 | * | 8/2025 | G11C 16/0483 |

OTHER PUBLICATIONS

Her, Y.C. et al., "Phase Transformation and Crystallization Kinetics Of A—Ge/Cu Bilayer For Blue-Ray Recording Under Thermal Annealing And Pulsed Laser Irradiation," Journal of Applied Physics, vol. 111, No. 4, p. 043503 (2012); https://doi.org/10.1063/1.3684966.

Ishiyama, T. et al., "Metal-induced lateral crystallization of germanium thin films," Materials & Design, vol. 232, Aug. 2023, p. 112116; https://doi.org/10.1016/j.maldes.2023.112116.

U.S. Appl. No. 18/343,118, filed Jun. 28, 2023, Western Digital Technologies, Inc.

U.S. Appl. No. 18/343,162, filed Jun. 28, 2023, Western Digital Technologies, Inc.

ISR-WO—Notification of Transmittal of The International Search Report and The Written Opinion of the International Searching Authority for International Patent Application No. PCT/US2024/054603, mailed Feb. 20, 2025, 14 pages.

Nasir, S. et al., "Temperature dependent aluminum induced crystallization of amorphous germanium thin films," Chemical Physics Letters, vol. 831, 2023, 140848, ISSN 0009-2614, https://doi.org/10.1016/j.cplett.2023.140848.

IPRP-WO—Notification Concerning Transmittal of International Preliminary Report on Patentability and Written Opinion of the International Searching Authority for International Patent Application No. PCT/US2024/054603, mailed. Aug. 20, 2026, 9 pages.

* cited by examiner

MEMORY DEVICE INCLUDING A GERMANIUM-CONTAINING SOURCE STRUCTURE AND METHODS FOR FORMING THE SAME

FIELD

The present disclosure relates generally to the field of semiconductor devices, and particularly to a memory device including a germanium-containing source structure and methods for forming the same.

BACKGROUND

Three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a memory device includes a polycrystalline germanium-containing semiconductor source line layer containing germanium at an atomic percentage greater than 50%, an alternating stack of insulating layers and electrically conductive layers located over the polycrystalline germanium-containing semiconductor source line layer, a memory opening vertically extending through the alternating stack, a memory opening fill structure located in the memory opening and including a memory film and a vertical semiconductor channel having an end surface in electrical contact with the polycrystalline germanium-containing semiconductor source line layer, and an interfacial metal alloy layer located between the polycrystalline germanium-containing semiconductor source line layer and a bottommost insulating layer within the alternating stack.

According to another aspect of the present disclosure, a method of forming a memory device comprises forming an alternating stack of insulating layers and spacer material layers over a carrier substrate, wherein the spacer material layers are formed as or are subsequently replaced with electrically conductive layers; forming a memory opening through the alternating stack; forming a memory opening fill structure in the memory opening, wherein the memory opening fill structure comprises a memory film and a vertical semiconductor channel; removing the carrier substrate; removing an end portion of the memory film to physically expose an end portion of the vertical semiconductor channel; depositing an amorphous germanium-containing semiconductor layer on a bottom surface of the alternating stack and on the physically exposed end portion of the vertical semiconductor channel; depositing a metal containing layer comprising a metal on the amorphous germanium-containing semiconductor layer; and converting the amorphous germanium-containing semiconductor layer into a polycrystalline germanium-containing semiconductor source line layer using metal-induced crystallization by diffusing metal atoms from the metal containing layer through the amorphous germanium-containing semiconductor layer.

DETAILED DESCRIPTION

Figure 1:
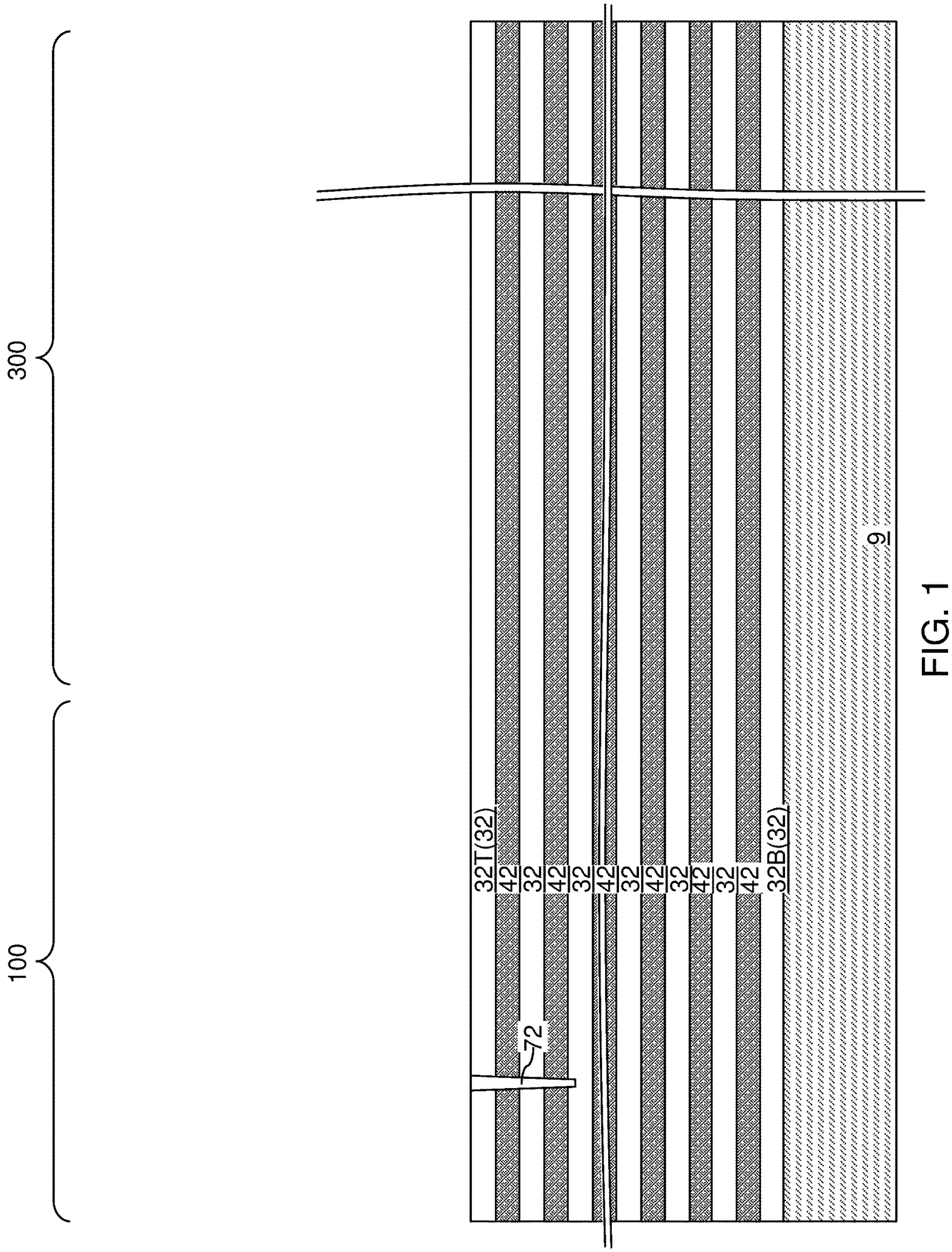
FIG. 1 is a schematic vertical cross-sectional view of an exemplary structure after formation of an alternating stack of insulating layers and sacrificial material layers over a carrier substrate according to an embodiment of the present disclosure.

As discussed above, the embodiments of the present disclosure are directed to a memory device including a germanium-containing source structure and methods for forming the same, the various aspects of which are described below. Embodiments of the disclosure can be employed to form various structures including a multilevel memory structure, non-limiting examples of which include three-dimensional memory devices comprising a plurality of memory strings.

The drawings are not drawn to scale. Multiple instances of an element may be duplicated where a single instance of the element is illustrated, unless absence of duplication of elements is expressly described or clearly indicated otherwise. Ordinals such as “first,” “second,” and “third” are employed merely to identify similar elements, and different ordinals may be employed across the specification and the claims of the instant disclosure. The term “at least one” element refers to all possibilities including the possibility of a single element and the possibility of multiple elements.

The same reference numerals refer to the same element or similar element. Unless otherwise indicated, elements having the same reference numerals are presumed to have the same composition and the same function. Unless otherwise indicated, a “contact” between elements refers to a direct contact between elements that provides an edge or a surface shared by the elements. If two or more elements are not in direct contact with each other or among one another, the two elements are “disjoined from” each other or “disjoined among” one another. As used herein, an element located “on” a second element can be located on the exterior side of a surface of the second element or on the interior side of the second element. As used herein, an element is located “directly on” a second element if there exist a physical contact between a surface of the element and a surface of the second element. As used herein, an element is “electrically connected to” a second element if there exists a conductive path consisting of at least one conductive material between the element and the second element. As used herein, a “prototype” structure or an “in-process” structure refers to a transient structure that is subsequently modified in the shape or composition of at least one component therein.

As used herein, a “layer” refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

Generally, a semiconductor die, or a semiconductor package, can include a memory chip. Each semiconductor package contains one or more dies (for example one, two, or four). The die is the smallest unit that can independently execute commands or report status. Each die contains one or more planes (typically one or two). Identical, concurrent operations can take place on each plane, although with some restrictions. Each plane contains a number of blocks, which are the smallest unit that can be erased in a single erase operation. Each block contains a number of pages, which are the smallest unit that can be programmed, i.e., a smallest unit on which a read operation can be performed.

As used herein, a “semiconducting material” refers to a material having electrical conductivity in the range from $1\times10^{-5}$ S/m to $1\times10^{-5}$ S/m. As used herein, a “semiconductor material” refers to a material having electrical conductivity in the range from $1\times10^{-5}$ S/m to 1 S/m in the absence of electrical dopants therein, and is capable of producing a doped material having electrical conductivity in a range from 1 S/m to $1\times10^{7}$ S/m upon suitable doping with an electrical dopant. As used herein, an “electrical dopant” refers to a p-type dopant that adds a hole to a valence band within a band structure, or an n-type dopant that adds an electron to a conduction band within a band structure. As used herein, a “conductive material” refers to a material having electrical conductivity greater than $1\times10^{5}$ S/m. As used herein, an “insulator material” or a “dielectric material” refers to a material having electrical conductivity less than $1\times10^{-5}$ S/m. As used herein, a “heavily doped semiconductor material” refers to a semiconductor material that is doped with electrical dopant at a sufficiently high atomic concentration to become a conductive material either as formed as a crystalline material or if converted into a crystalline material through an anneal process (for example, from an initial amorphous state), i.e., to provide electrical conductivity greater than $1\times10^{5}$ S/m. A “doped semiconductor material” may be a heavily doped semiconductor material, or may be a semiconductor material that includes electrical dopants (i.e., p-type dopants and/or n-type dopants) at a concentration that provides electrical conductivity in the range from $1\times10^{-5}$ S/m to $1\times10^{7}$ S/m. An “intrinsic semiconductor material” refers to a semiconductor material that is not doped with electrical dopants. Thus, a semiconductor material may be semiconducting or conductive, and may be an intrinsic semiconductor material or a doped semiconductor material. A doped semiconductor material may be semiconducting or conductive depending on the atomic concentration of electrical dopants therein. As used herein, a “metallic material” refers to a conductive material including at least one metallic element therein. All measurements for electrical conductivities are made at the standard condition.

Referring to FIG. 1, an exemplary structure according to an embodiment of the present disclosure is illustrated. The exemplary structure comprises a carrier substrate 9, which may be a semiconductor substrate or a conductive substrate. For example, the carrier substrate 9 may comprise a commercially available silicon wafer. Alternatively, the carrier substrate 9 may comprise any material that may be removed selective the materials of insulating layers 32 and dielectric material portions to be subsequently formed.

An alternating stack of first material layers and second material layers can be formed over the carrier substrate 9. The first material layers may be insulating layers, and the second material layers may be spacer material layers. In one embodiment, the spacer material layers may comprise sacrificial material layers 42. In this case, an alternating stack (32, 42) of insulating layers 32 and sacrificial material layers 42 can be formed over the carrier substrate 9. The insulating layers 32 comprise an insulating material such as undoped silicate glass or a doped silicate glass, and the sacrificial material layers 42 comprise a sacrificial material such as silicon nitride or a silicon-germanium alloy. In one embodiment, the insulating layers 32 (i.e., the first material layers) may comprise silicon oxide layers, and the sacrificial material layers 42 (i.e., the second material layers) may comprise silicon nitride layers.

The alternating stack (32, 42) may comprise multiple repetitions of a unit layer stack including an insulating layer 32 and a sacrificial material layer 42. The total number of repetitions of the unit layer stack within the alternating stack (32, 42) may be, for example, in a range from 8 to 1,024, such as from 32 to 256, although lesser and greater number of repetitions may also be employed. The topmost one of the insulating layers 32 is hereafter referred to as a topmost insulating layer 32T. The bottommost one of the insulating layers 32 is an insulating layer 32 that is most proximal to the carrier substrate 9 is herein referred to as a bottommost insulating layer 32B.

Each of the insulating layers 32 other than the topmost insulating layer 32T may have a thickness in a range from 20 nm to 100 nm, such as from 30 nm to 60 nm, although lesser and greater thicknesses may also be employed. Each of the sacrificial material layers 42 may have a thickness in a range from 20 nm to 100 nm, such as from 30 nm to 60 nm, although lesser and greater thicknesses may also be employed. In one embodiment, the topmost insulating layer 32T may have a thickness of about one half of the thickness of other insulating layers 32.

The exemplary structure comprises a memory array region 100 in which a three-dimensional array of memory elements is to be subsequently formed, and a contact region 300 in which layer contact via structures contacting word lines are to be subsequently formed. Drain-select-level isolation structures 72 laterally extending along a first horizontal direction hd1 may be formed through a subset of the uppermost sacrificial material layers 42 that will be replaced with drain side select gate electrodes.

While an embodiment is described in which the spacer material layers are formed as sacrificial material layers 42, the spacer material layers may be formed as electrically conductive layers in an alternative embodiment. Generally, spacer material layers of the present disclosure may be formed as, or may be subsequently replaced at least partly with, electrically conductive layers.

Figure 2:
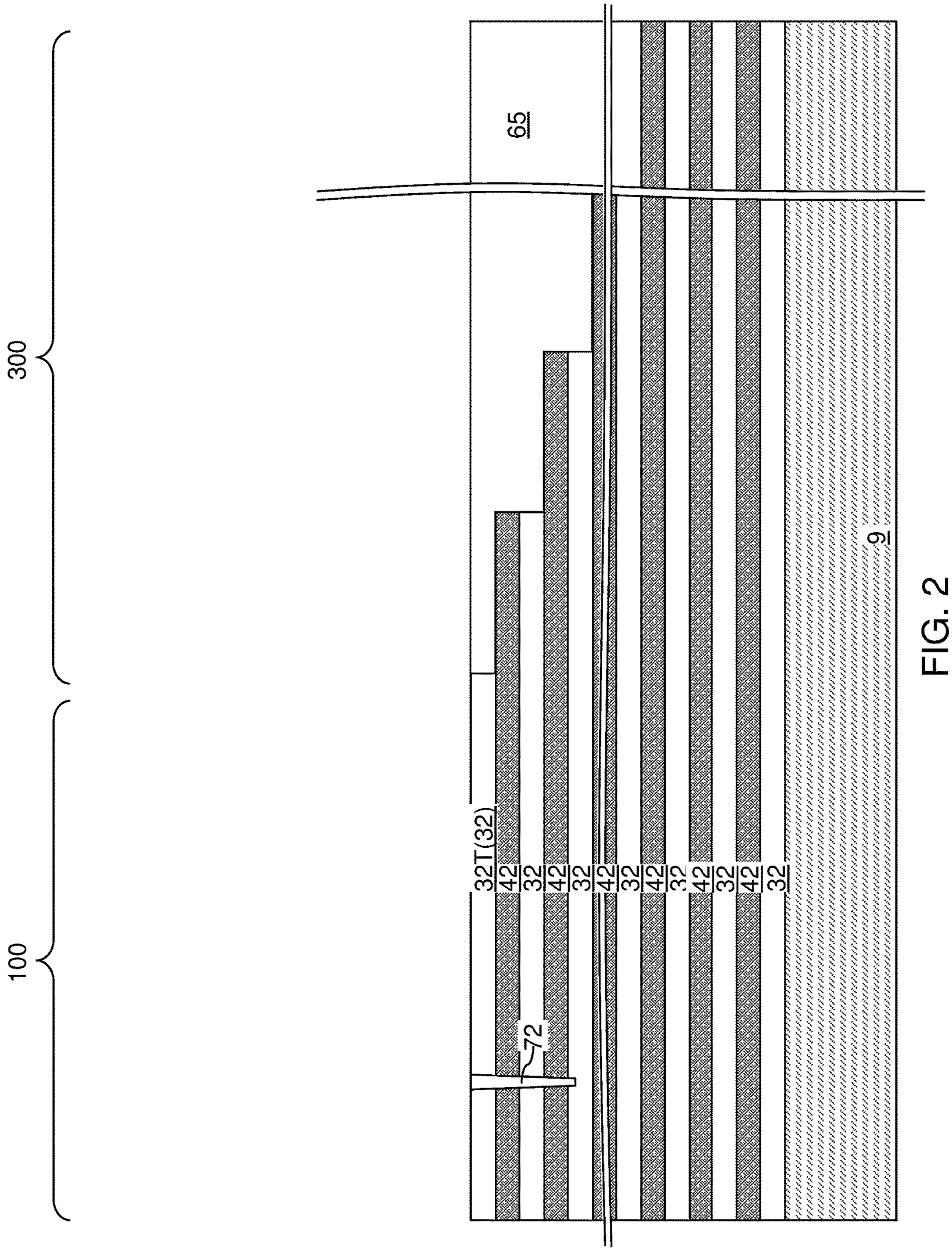
FIG. 2 is a schematic vertical cross-sectional view of the exemplary structure after formation of stepped surfaces and a stepped dielectric material portion according to an embodiment of the present disclosure.

Referring to FIG. 2, optional stepped surfaces are formed in the contact region 300. As used herein, "stepped surfaces" refer to a set of surfaces that include at least two horizontal surfaces and at least two vertical surfaces such that each horizontal surface is adjoined to a first vertical surface that extends upward from a edge of the horizontal surface, and is adjoined to a second vertical surface that extends downward from a second edge of the horizontal surface. A stepped cavity is formed within the volume from which portions of the alternating stack (32, 42) are removed through formation of the stepped surfaces. A "stepped cavity" refers to a cavity having stepped surfaces.

The stepped cavity can have various stepped surfaces such that the horizontal cross-sectional shape of the stepped cavity changes in steps as a function of the vertical distance from the top surface of the carrier substrate 9. In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

Each sacrificial material layer 42 other than a topmost sacrificial material layer 42 within the alternating stack (32, 42) laterally extends farther than any overlying sacrificial material layer 42 within the alternating stack (32, 42) in the terrace region. The stepped surfaces of the alternating stack (32, 42) continuously extend from a bottommost layer within the alternating stack (32, 42) (such as the bottommost insulating layer 32B) to a topmost layer within the alternating stack (32, 42) (such as the topmost insulating layer 32T).

A stepped dielectric material portion 65 (i.e., an insulating fill material portion) can be formed in the stepped cavity by deposition of a dielectric material therein. For example, a dielectric material such as silicon oxide can be deposited in the stepped cavity. Excess portions of the deposited dielectric material can be removed from above the top surface of the topmost insulating layer 32T, for example, by chemical mechanical planarization (CMP). The remaining portion of the deposited dielectric material filling the stepped cavity constitutes the stepped dielectric material portion 65. As used herein, a "stepped" element refers to an element that has stepped surfaces and a horizontal cross-sectional area that increases or decreases stepwise as a function of a vertical distance from a top surface of a substrate on which the element is present. If silicon oxide is employed for the stepped dielectric material portion 65, the silicon oxide of the stepped dielectric material portion 65 may, or may not, be doped with dopants such as B, P, and/or F.

Figure 3A:
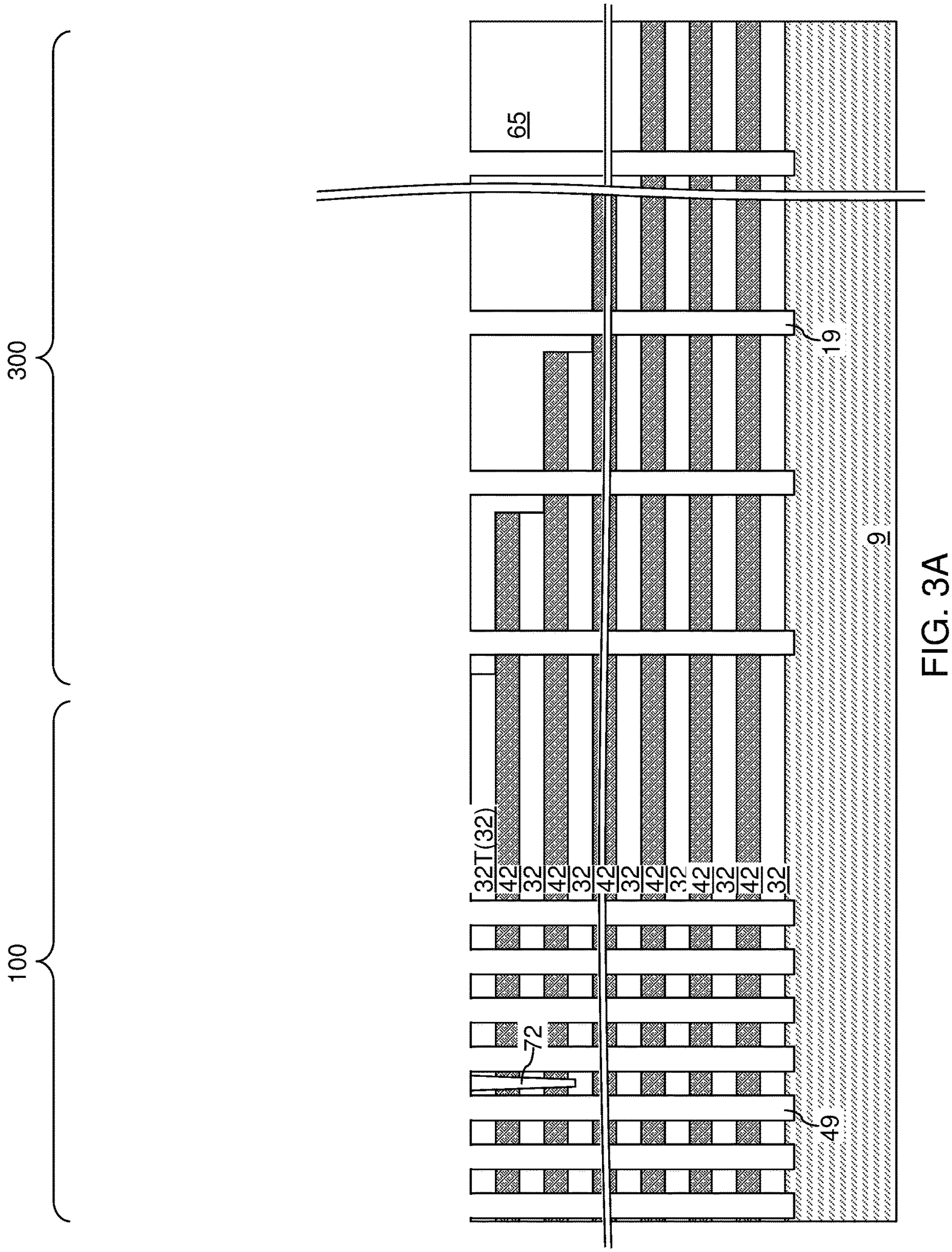
FIG. 3A is a schematic vertical cross-sectional view of the exemplary structure after formation of memory openings and support openings according to an embodiment of the present disclosure.
Figure 3B:
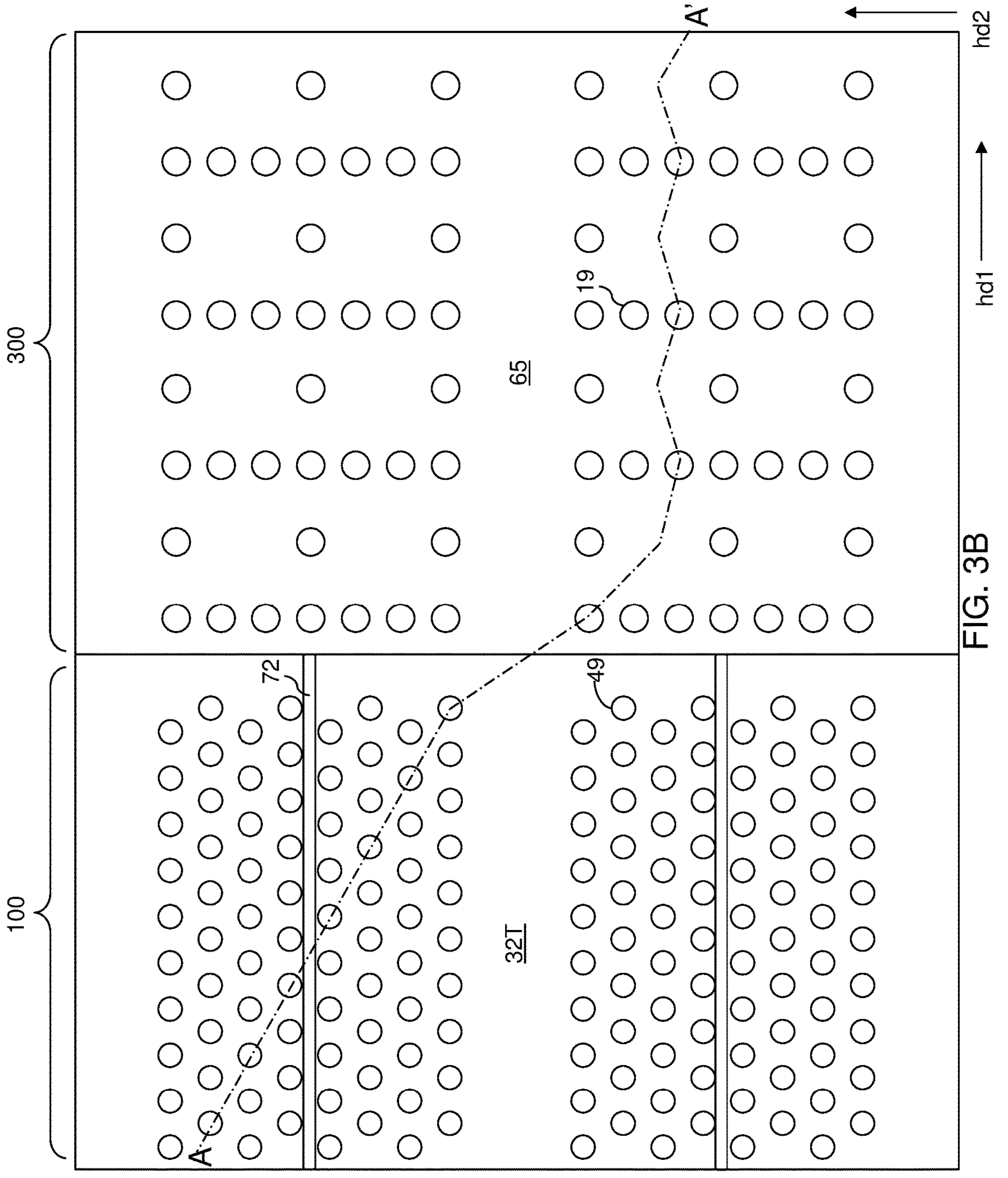
FIG. 3B is a top-down view of the exemplary structure of FIG. 3A. The hinged vertical cross-sectional plane A-A' is the cut plane of the vertical cross-sectional view of FIG. 3A.

Referring to FIGS. 3A and 3B, an etch mask layer (such as a photoresist layer) can be formed over the alternating stack (32, 42), and can be lithographically patterned to form openings in the memory array region 100 and in the contact region 300. An anisotropic etch process can be performed to transfer the pattern of the openings in the etch mask layer through the stepped dielectric material portion 65 and the alternating stack (32, 42). Memory openings 49 are formed through the alternating stack (32, 42) in the memory array region 100. Support openings 19 can optionally be formed through the stepped dielectric material portion 65 and the alternating stack (32, 42) in the contact region 300.

Each of the memory openings 49 and the support openings 19 can vertically extend into the carrier substrate 9. In one embodiment, bottom surfaces of the memory openings 49 and the support openings 19 may be formed at or below the top surface of the carrier substrate 9. The memory openings 49 may have a diameter in a range from 60 nm to 400 nm, such as from 120 nm to 300 nm, although lesser and greater thicknesses may be employed. The support openings 19 may have a diameter in a range from 60 nm to 400 nm, such as from 120 nm to 300 nm, although lesser and greater thicknesses may be employed.

Each cluster of memory openings 49 (which corresponds to an area of a memory block) may comprise a plurality of rows of memory openings 49. Each row of memory openings 49 may comprise a plurality of memory openings 49 that are arranged along the first horizontal direction (e.g., word line direction) hd1 with a uniform pitch. The rows of memory openings 49 may be laterally spaced from each other along the second horizontal direction (e.g., bit line direction) hd2, which may be perpendicular to the first horizontal direction hd1. In one embodiment, each cluster of memory openings 49 may be formed as a two-dimensional periodic array of memory openings 49.

Figure 4:
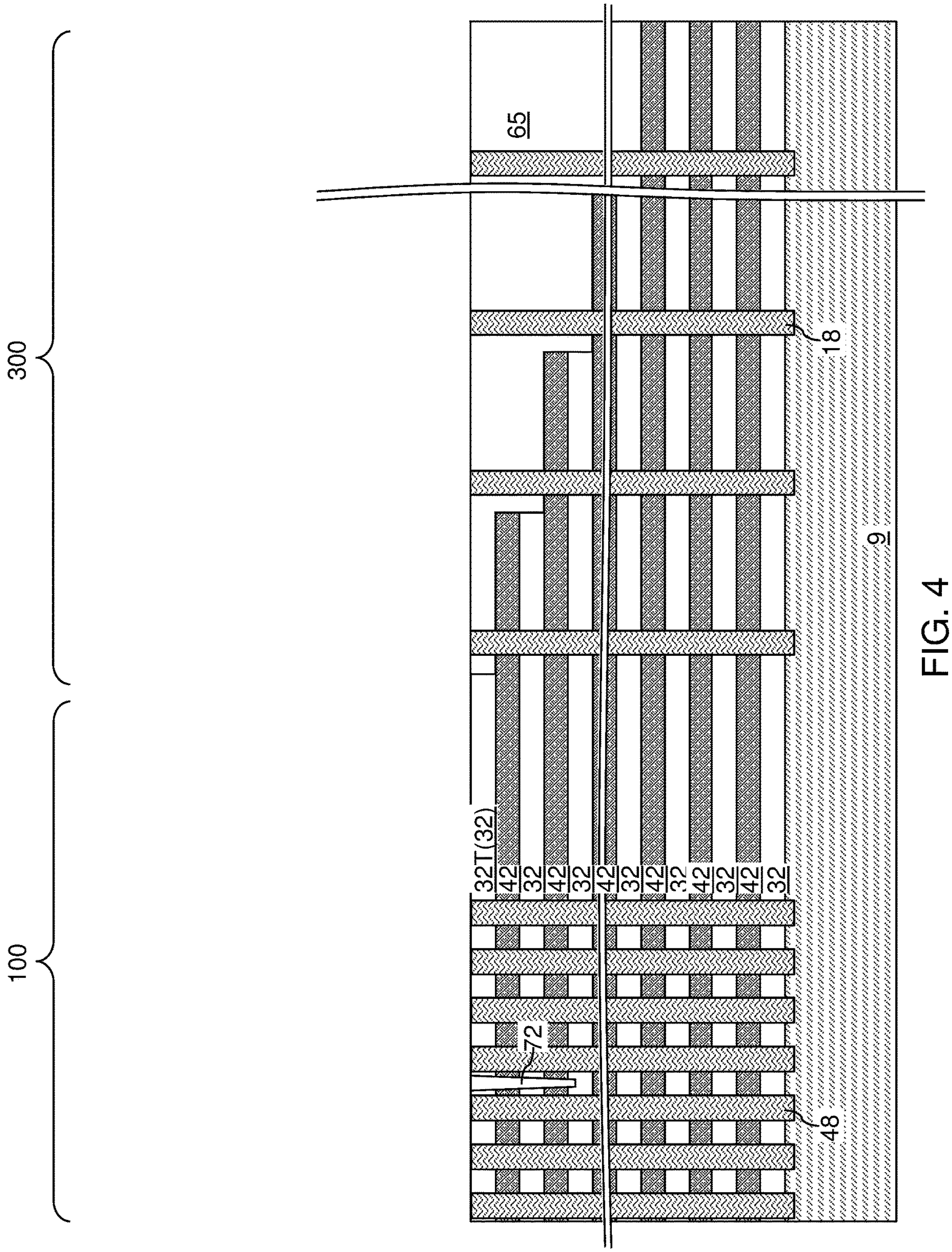
FIG. 4 is a schematic vertical cross-sectional view of the exemplary structure after formation of sacrificial opening fill structures according to an embodiment of the present disclosure.

Referring to FIG. 4, an optional sacrificial liner layer (such as a thin silicon oxide layer) and a sacrificial fill material can be deposited in the memory openings 49 and in the support openings 19. The sacrificial fill material may comprise a carbon-based material (such as amorphous carbon or diamond-like carbon), a semiconductor material such as amorphous silicon or silicon-germanium), a polymer material, or a dielectric material (such as organosilicate glass or borosilicate glass). Excess portions of the sacrificial fill material may be removed from above the horizontal plane including the top surface of the topmost insulating layer 32T. Each remaining portion of the sacrificial fill material that fills a memory opening 49 constitutes a sacrificial memory opening fill structure 48. Each remaining portion of the sacrificial fill material that fill a support opening 19 constitutes a sacrificial support opening fill structure 18.

Figure 5:
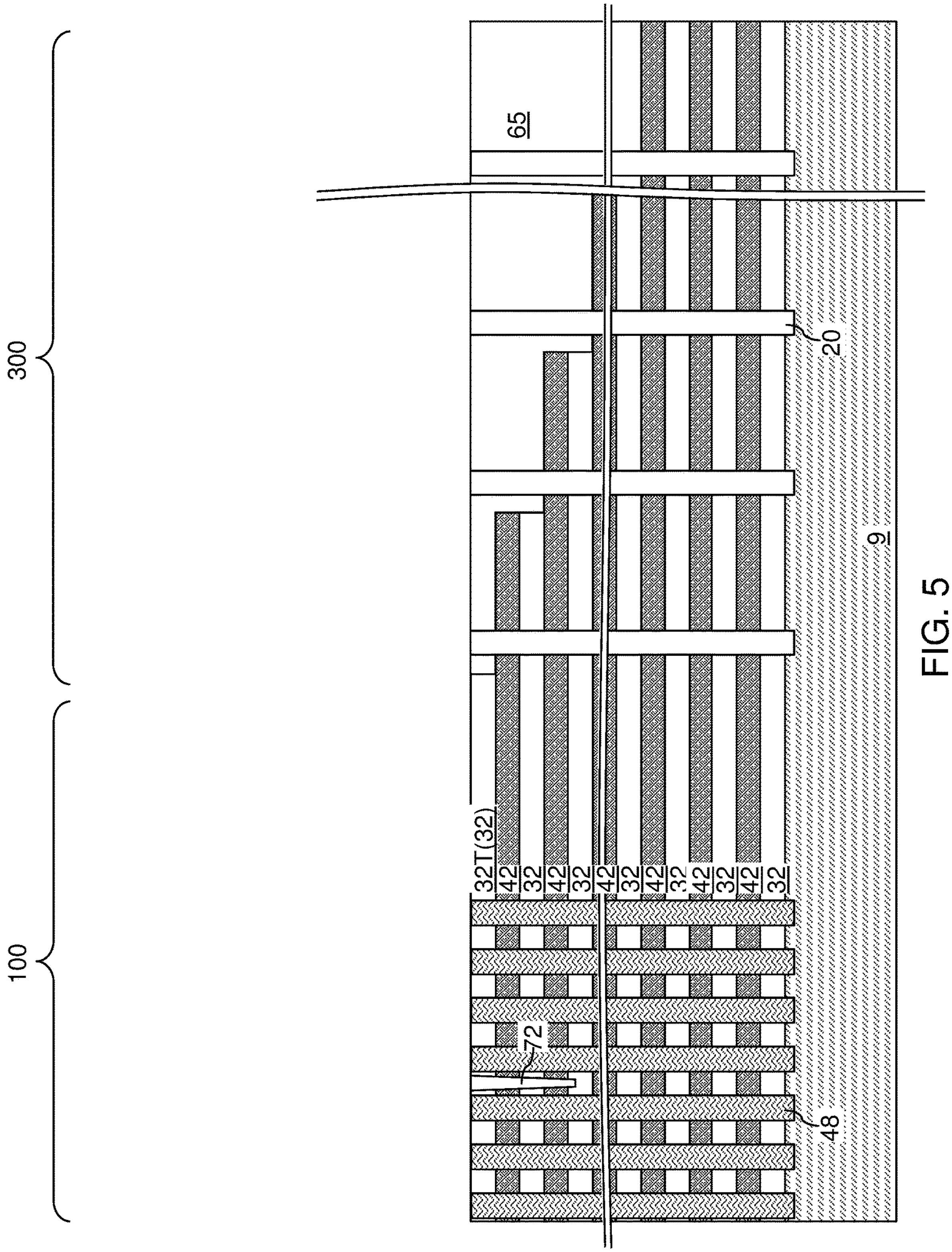
FIG. 5 is a vertical cross-sectional view of the exemplary structure after formation of support pillar structures according to an embodiment of the present disclosure.

Referring to FIG. 5, a photoresist layer (not shown) can be applied over the exemplary structure, and can be lithographically patterned to cover the sacrificial memory opening fill structures 48 in the memory array region 100 without covering the sacrificial support opening fill structures 18 in the contact region 300. The sacrificial support opening fill structures 18 are subsequently removed selective to the materials of the insulating layers 32, the sacrificial material layers 42, and the carrier substrate 9 by ashing or selective etching. Voids are formed in the volumes of the support openings 19 from which the sacrificial support opening fill structures 18 are removed.

A dielectric fill material, such as silicon oxide, can be deposited in the support openings 19 by a conformal deposition process. Excess portions of the dielectric fill material can be removed from above the top surface of the topmost insulating layer 32T, for example, by a recess etch process. Each portion of the dielectric fill material that fills a respective support opening 19 constitutes a support pillar structure 20, which can be employed to provide structural support to the insulating layers 32 and the stepped dielectric material portion 65 during replacement of the sacrificial material layers 42 with electrically conductive layers. Alternatively, the support openings 19 can be formed at a later step at the same time as the memory openings, and the support pillar structures 20 can be formed in the support openings 19 at the same time as the memory opening fill structures are formed in the memory openings, as will be described below.

Figure 6:
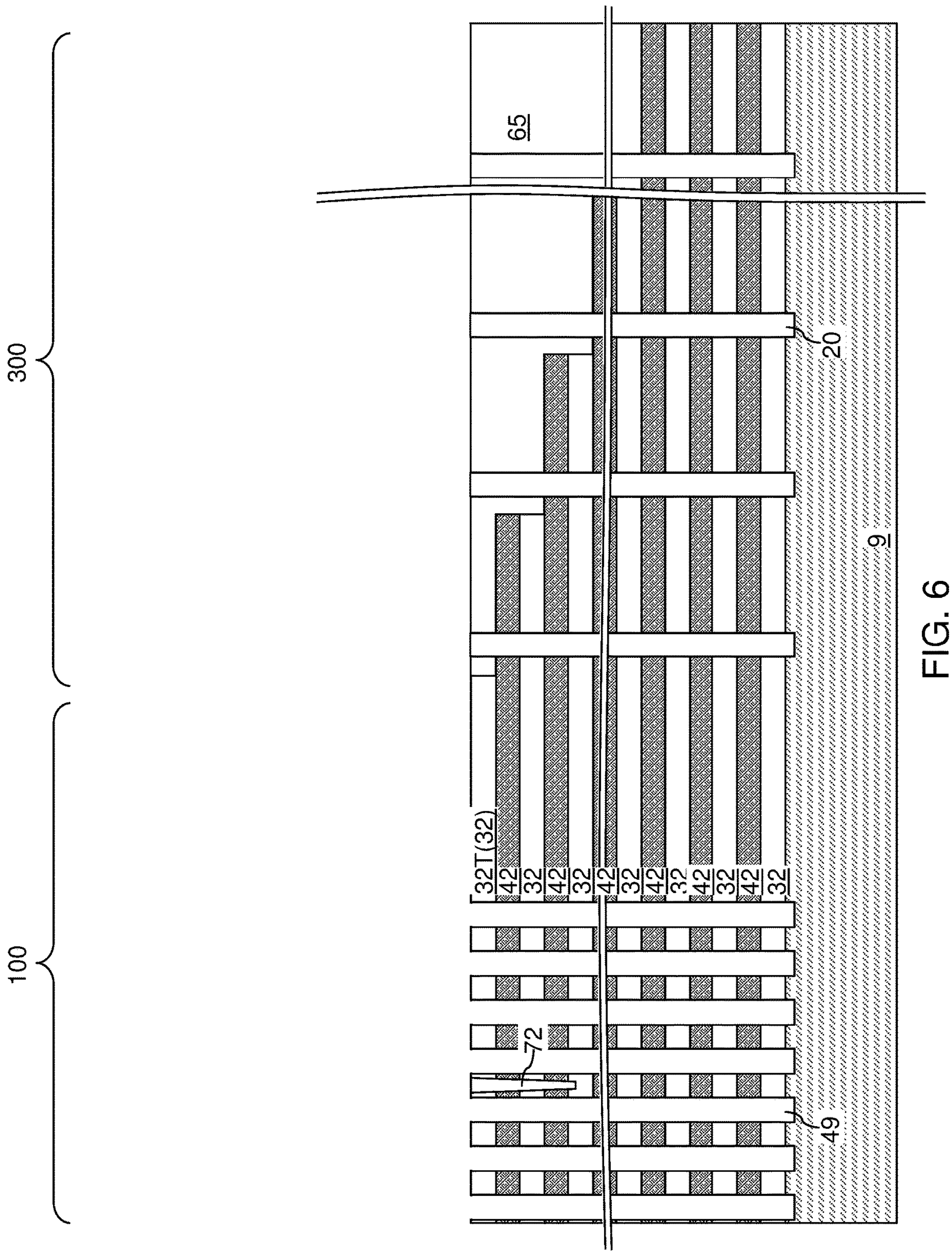
FIG. 6 is a schematic vertical cross-sectional view of the exemplary structure after removal of sacrificial memory opening fill structures according to an embodiment of the present disclosure.

Referring to FIG. 6, sacrificial memory opening fill structures 48 are subsequently removed selective to the materials of the insulating layers 32, the sacrificial material layers 42, and the carrier substrate 9. Voids are formed in the volumes of the memory openings 49 from which the sacrificial memory opening fill structures 48 are removed.

FIGS. 7A-7F are sequential vertical cross-sectional views of a memory opening 49 during formation of a memory opening fill structure 58 according to an embodiments of the present disclosure.

Figure 7B:
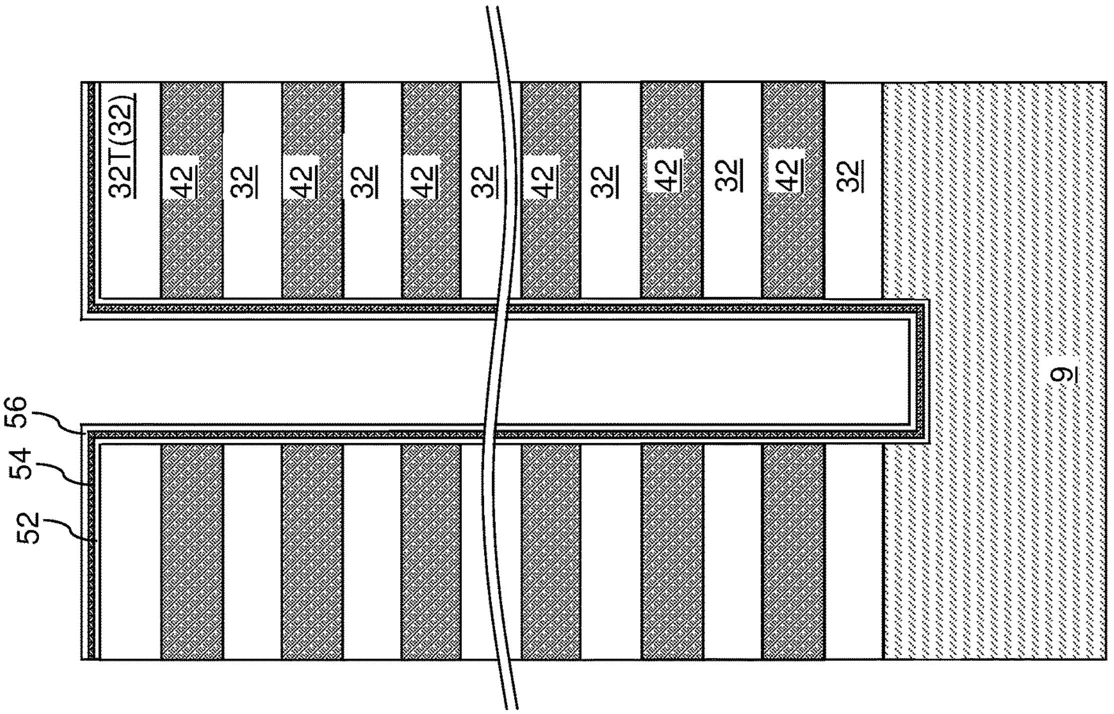
FIGS. 7A-7F are sequential vertical cross-sectional views of a memory opening during formation of a memory opening fill structure according to an embodiments of the present disclosure.
Figure 7A:
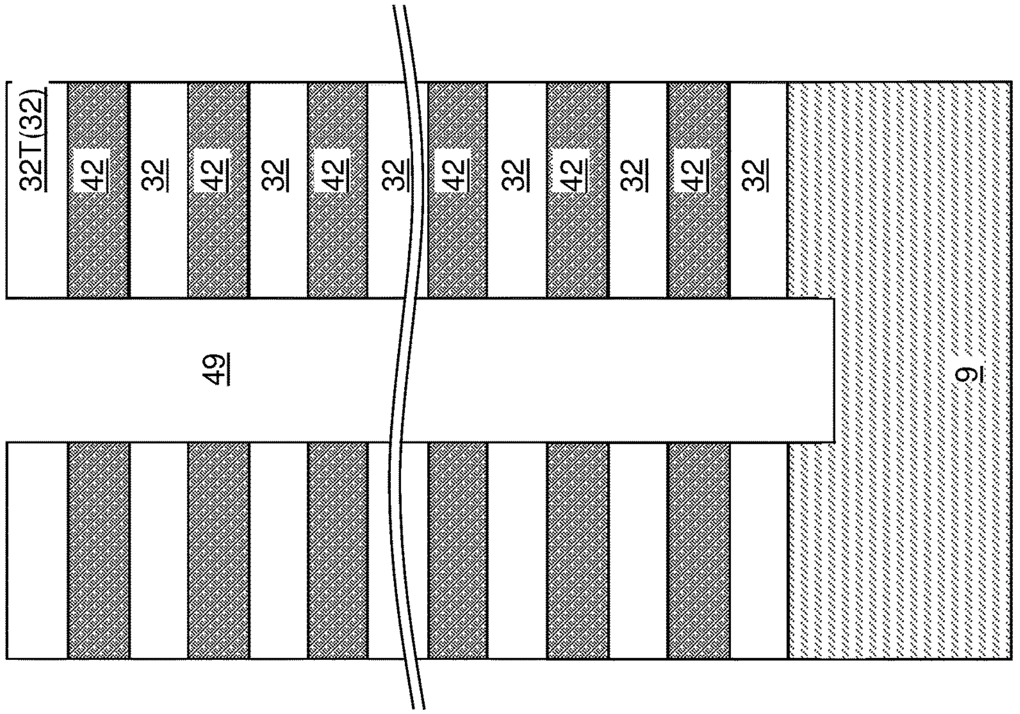

Referring to FIG. 7A, a memory opening 49 is illustrated after the processing steps of FIG. 6.

Referring to FIG. 7B, a layer stack including a memory material layer 54 can be conformally deposited. In an illustrative example, the layer stack may comprise an optional blocking dielectric layer 52, the memory material layer 54, and an optional dielectric liner 56. The memory material layer 54 includes a memory material, i.e., a material that can store data bits therein. The memory material layer 54 may comprise a charge storage material (such as silicon nitride), a ferroelectric material, a phase change memory material, or any other memory material that can store data bits by inducing a change in the electrical resistivity, ferroelectric polarization, or any other measurable physical property. In case the memory material layer 54 comprises a charge storage material, the optional dielectric liner 56 may comprise a tunneling dielectric layer.

Figure 7D:
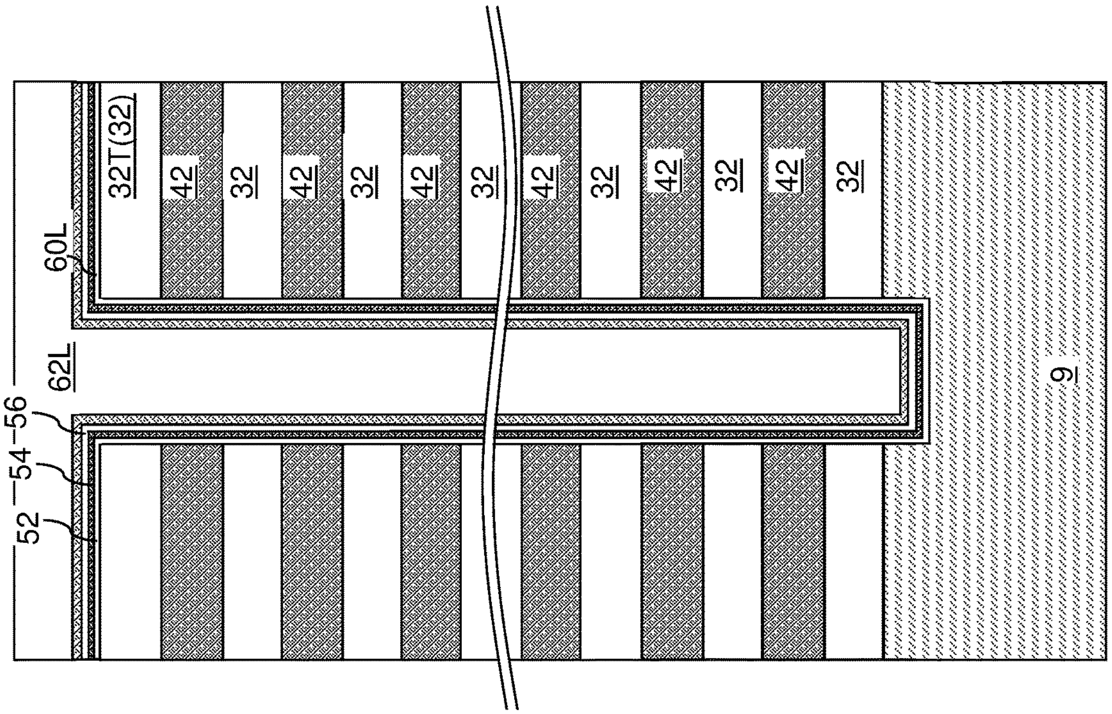
Figure 7C:
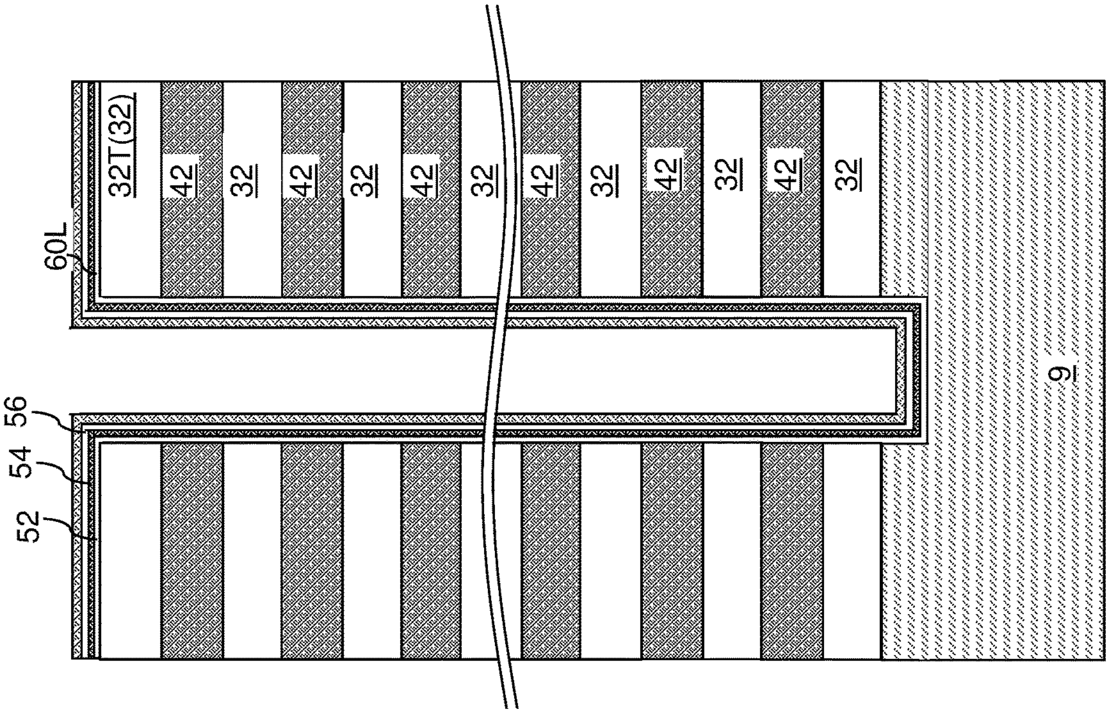

Referring to FIG. 7C, a semiconductor channel material layer 60L can be deposited over each memory film 50 by performing a conformal deposition process. If the semiconductor channel material layer 60L is doped, the semiconductor channel material layer 60L may have a doping of a first conductivity type, which may be p-type or n-type. The thickness of the semiconductor channel material layer 60L may be in a range from 5 nm to 50 nm, such as from 10 nm to 30 nm, although lesser and greater thicknesses may also be employed.

Referring to FIG. 7D, a dielectric core layer 62L comprising a dielectric fill material, such as silicon oxide, can be deposited in remaining volumes of the memory openings 49. While the dielectric core layer 62L can be deposited employing a conformal deposition process, such as a chemical vapor deposition process, the conformity of the conformal deposition process may not be perfect. Thus, the thickness of a bottom portion of the dielectric core layer 62L at the bottom of each memory opening 49 may be less than the thickness of an upper portion of the dielectric core layer 62L at the top of each memory opening 49.

Figure 7F:
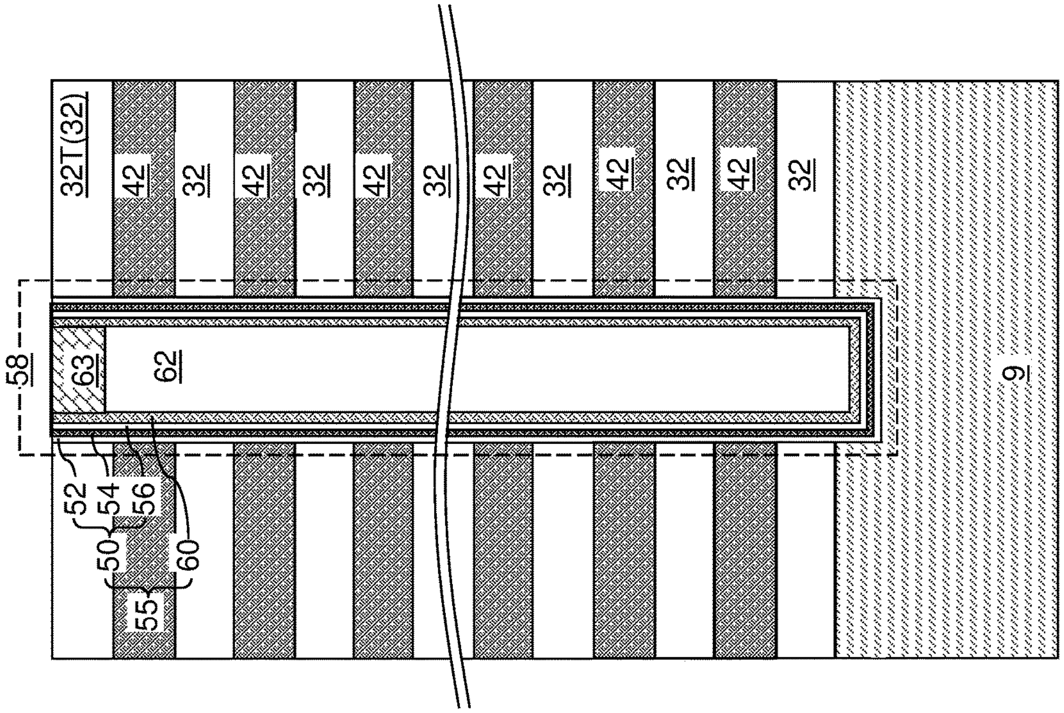
Figure 7E:
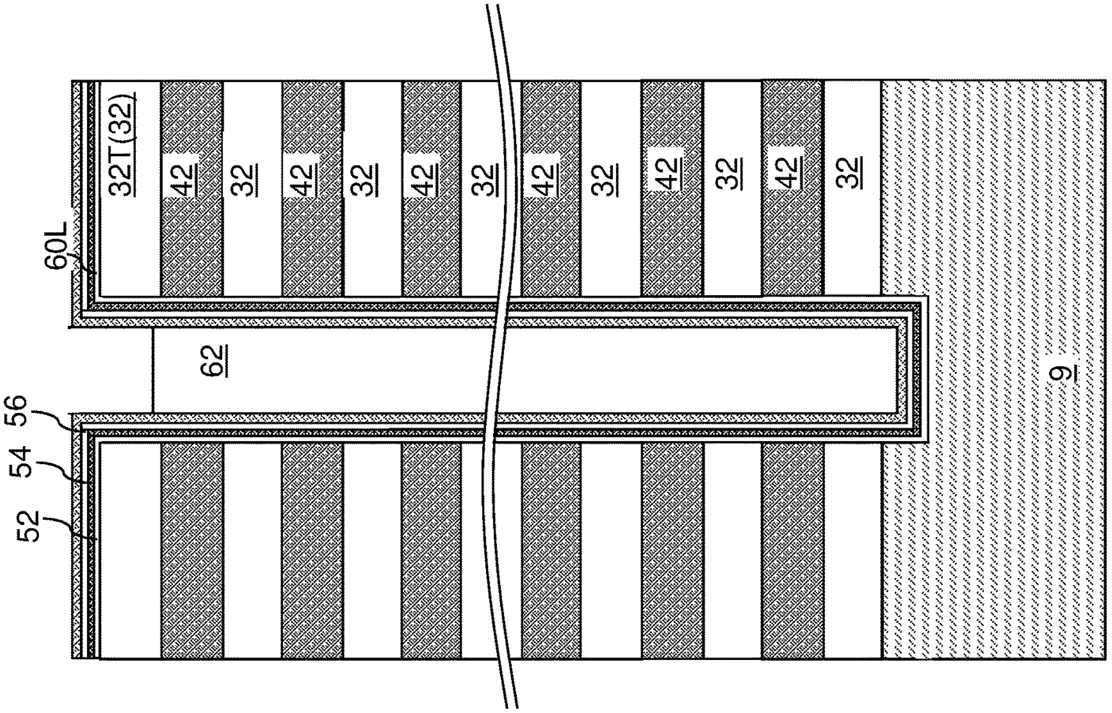

Referring to FIG. 7E, the dielectric core layer 62L can be vertically recessed such that each remaining portion of the dielectric core layer has a top surface at, or about, the horizontal plane including the bottom surface of the topmost insulating layers 32. Each remaining portion of the dielectric core layer constitutes a dielectric core 62.

Referring to FIG. 7F, a doped semiconductor material having a doping of a second conductivity type can be deposited within each recessed region above the dielectric cores 62. The second conductivity type is the opposite of the first conductivity type. For example, if the first conductivity type is p-type, the second conductivity type is n-type, and vice versa. The dopant concentration in the deposited semiconductor material can be in a range from $5\times10^{18}/cm^3$ to $2\times10^{21}/cm^3$, although lesser and greater dopant concentrations can also be employed. The doped semiconductor material can be, for example, doped polysilicon.

Excess portions of the deposited semiconductor material having a doping of the second conductivity type and a horizontal portion of the semiconductor channel material layer 60L can be removed from above the horizontal plane including the top surface of the topmost insulating layer 32T, for example, by chemical mechanical planarization (CMP) or a recess etch process. Each remaining portion of the doped semiconductor material having a doping of the second conductivity type constitutes a drain region 63. Each remaining portion of the semiconductor channel material layer 60L (which has a doping of the first conductivity type) constitutes a vertical semiconductor channel 60.

Each portion of the layer stack including the memory material layer 54 that remains in a respective memory opening 49 constitutes a memory film 50. In one embodiment, a memory film 50 may comprise an optional blocking dielectric layer 52, a memory material layer 54, and an optional dielectric liner 56. Each contiguous combination of a memory film 50 and a vertical semiconductor channel 60 constitutes a memory stack structure 55. Each combination a memory stack structure 55, a dielectric core 62, and a drain region 63 within a memory opening 49 constitutes a memory opening fill structure 58. Each memory opening fill structure 58 comprises a respective vertical stack of memory elements, which may comprise portions of the memory material layer 54 located at levels of the sacrificial material layers 42, or generally speaking, at levels of spacer material layers that may be formed as, or may be subsequently replaced at least partly with, electrically conductive layers.

In the alternative embodiment, the support pillar structures 20 may be formed in the support openings 19 at the same time as the memory opening fill structures 58 are formed in the memory openings 49. In this case, the support pillar structures 20 comprise the same materials as the memory opening fill structures 58.

An anneal process can be performed to activate electrical dopants in the drain region 63 and in the vertical semiconductor channel 60. In this case, any amorphous semiconductor material in the vertical semiconductor channel 60 is converted into a polycrystalline semiconductor material. In one embodiment, grains within the vertical semiconductor channel 60 may extends predominantly along long a respective local direction that is perpendicular to a respective proximal portion of an inner sidewall of the vertical semiconductor channel 60 and perpendicular to a respective proximal portion of an outer sidewall of the vertical semiconductor channel 60. As used herein, the grains extend predominantly along a specific direction if more than 50% of the drains extend along the specific direction.

Figure 8A:
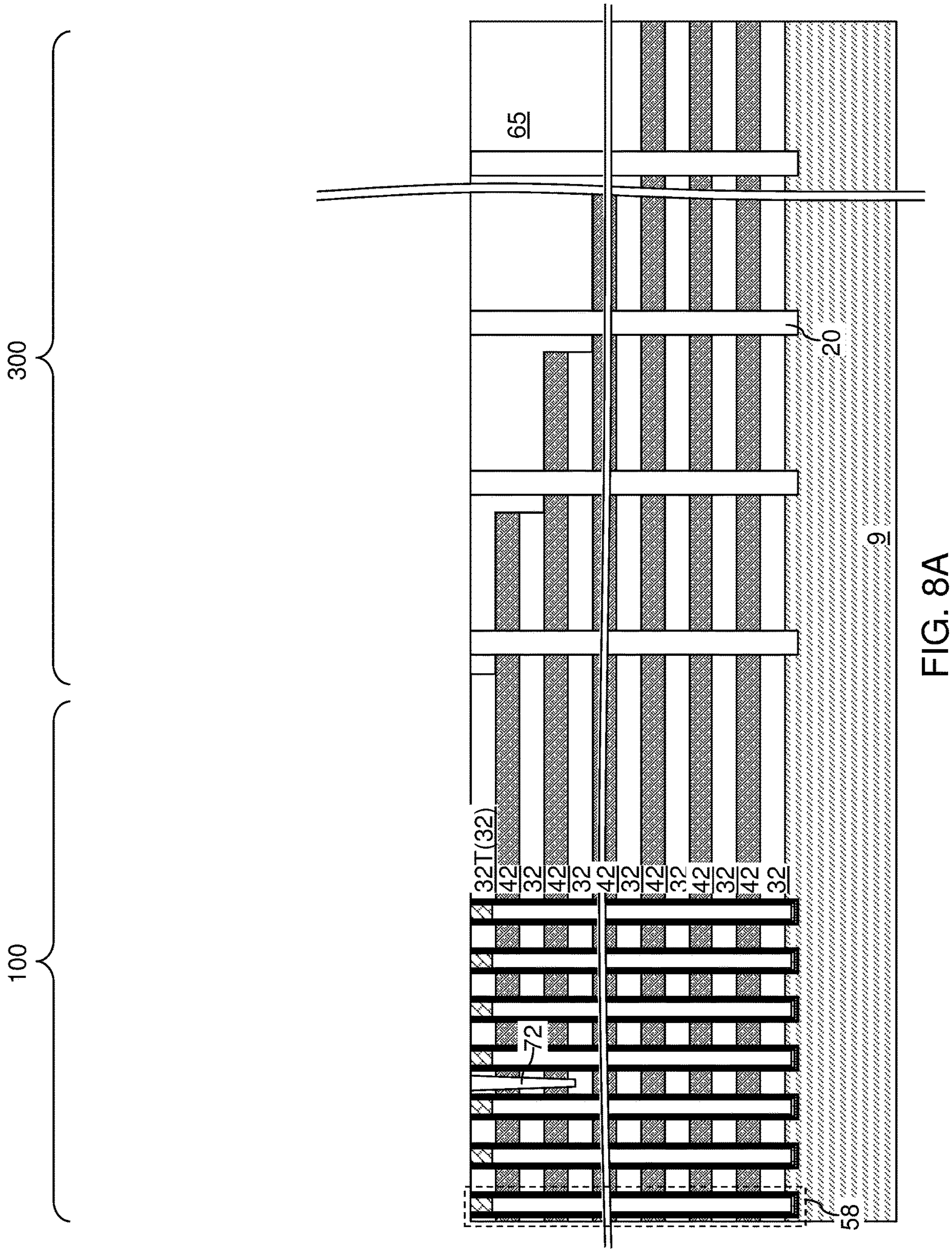
FIG. 8A is a schematic vertical cross-sectional view of the exemplary structure after formation of memory opening fill structures according to an embodiment of the present disclosure.
Figure 8B:
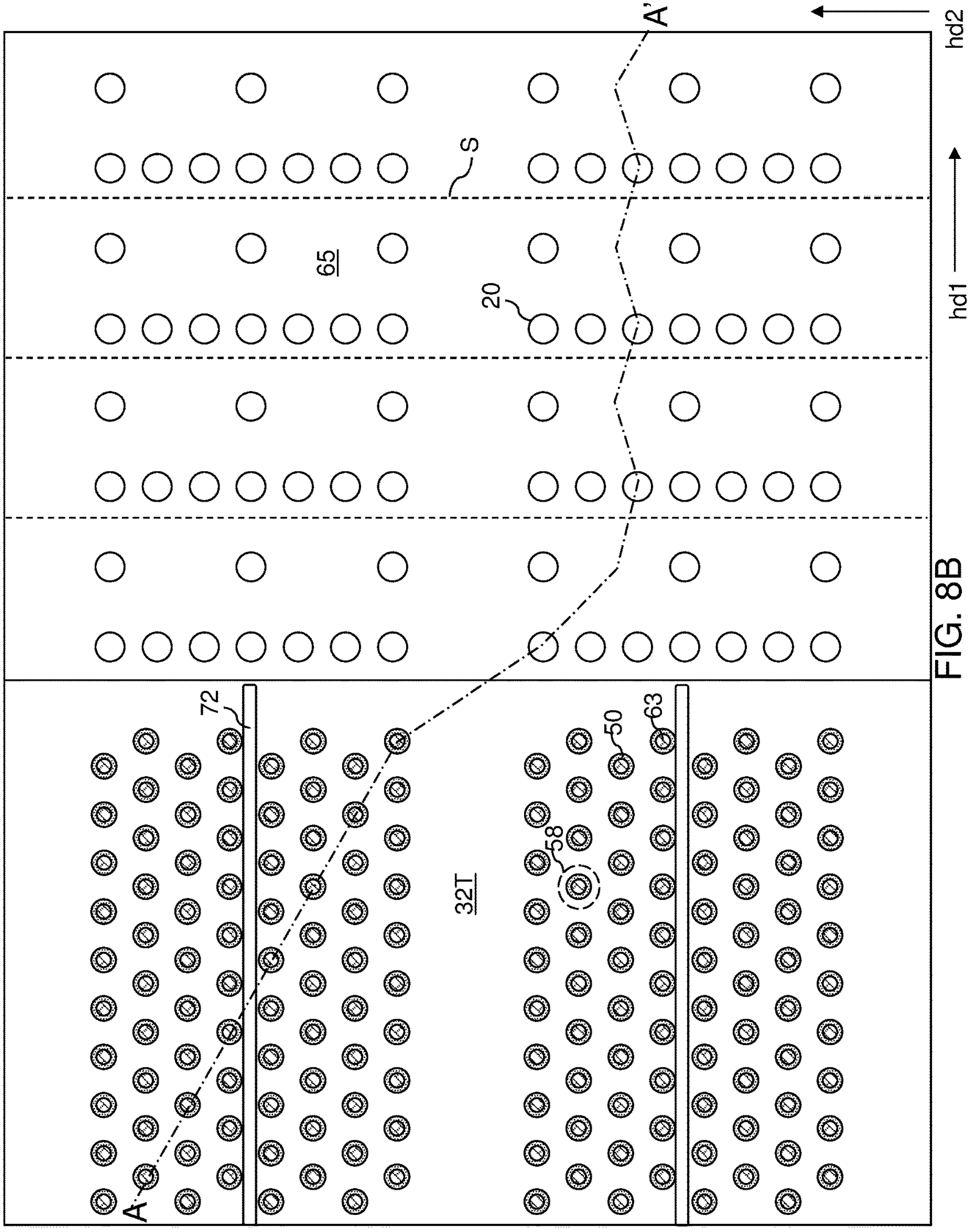
FIG. 8B is a top-down view of the exemplary structure of FIG. 8A. The vertical plane A-A is the cut plane of the vertical cross-sectional view of FIG. 8A.

Referring to FIGS. 8A and 8B, the exemplary structure is illustrated after formation of memory opening fill structures 58 within the memory openings 49. The memory opening fill structures 58 are located in the memory openings 49. Each of the memory opening fill structures 58 comprises a respective memory film 50 and a respective vertical semiconductor channel 60.

Figure 9A:
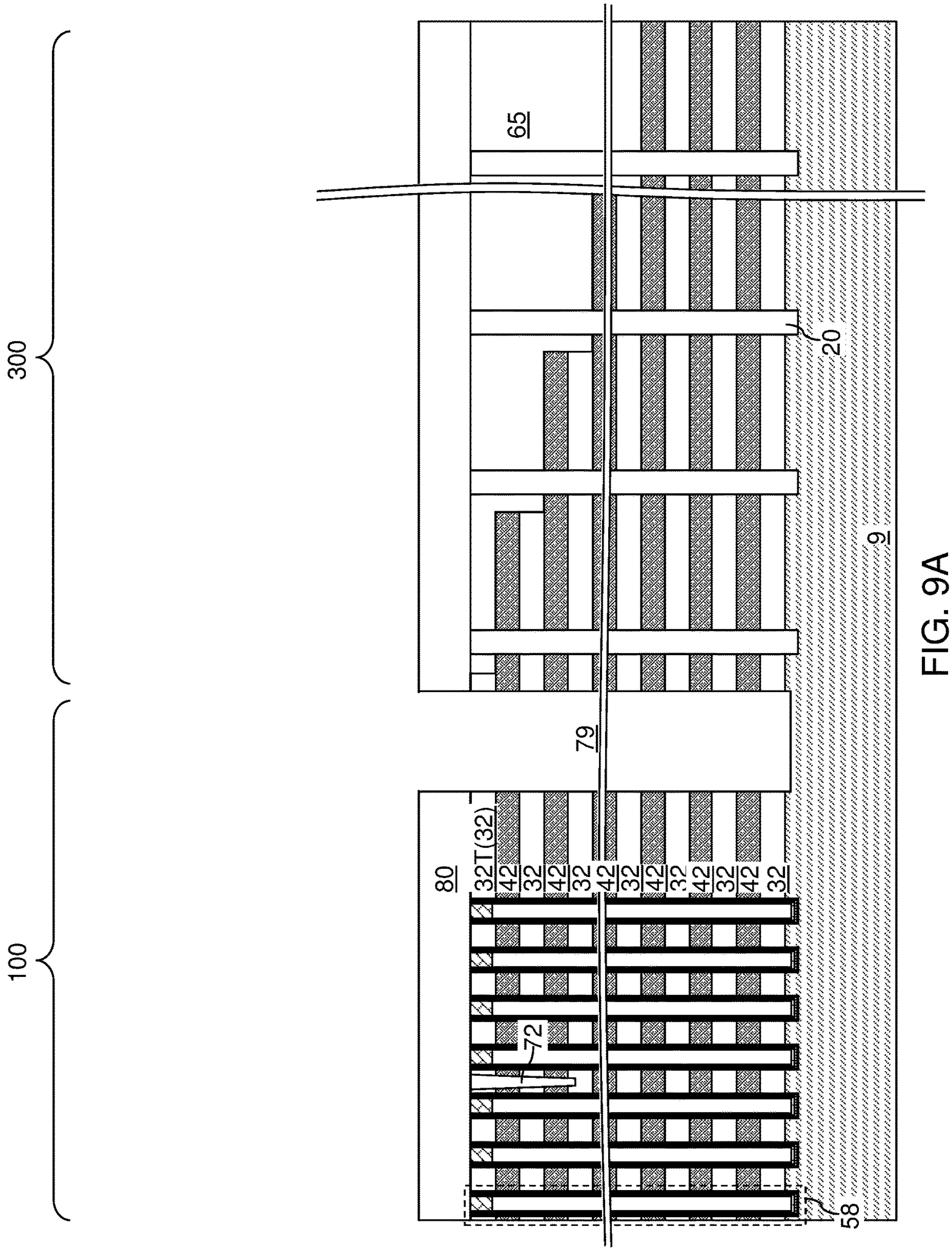
FIG. 9A is a vertical cross-sectional view of the exemplary structure after formation of lateral isolation trenches according to an embodiment of the present disclosure.
Figure 9B:
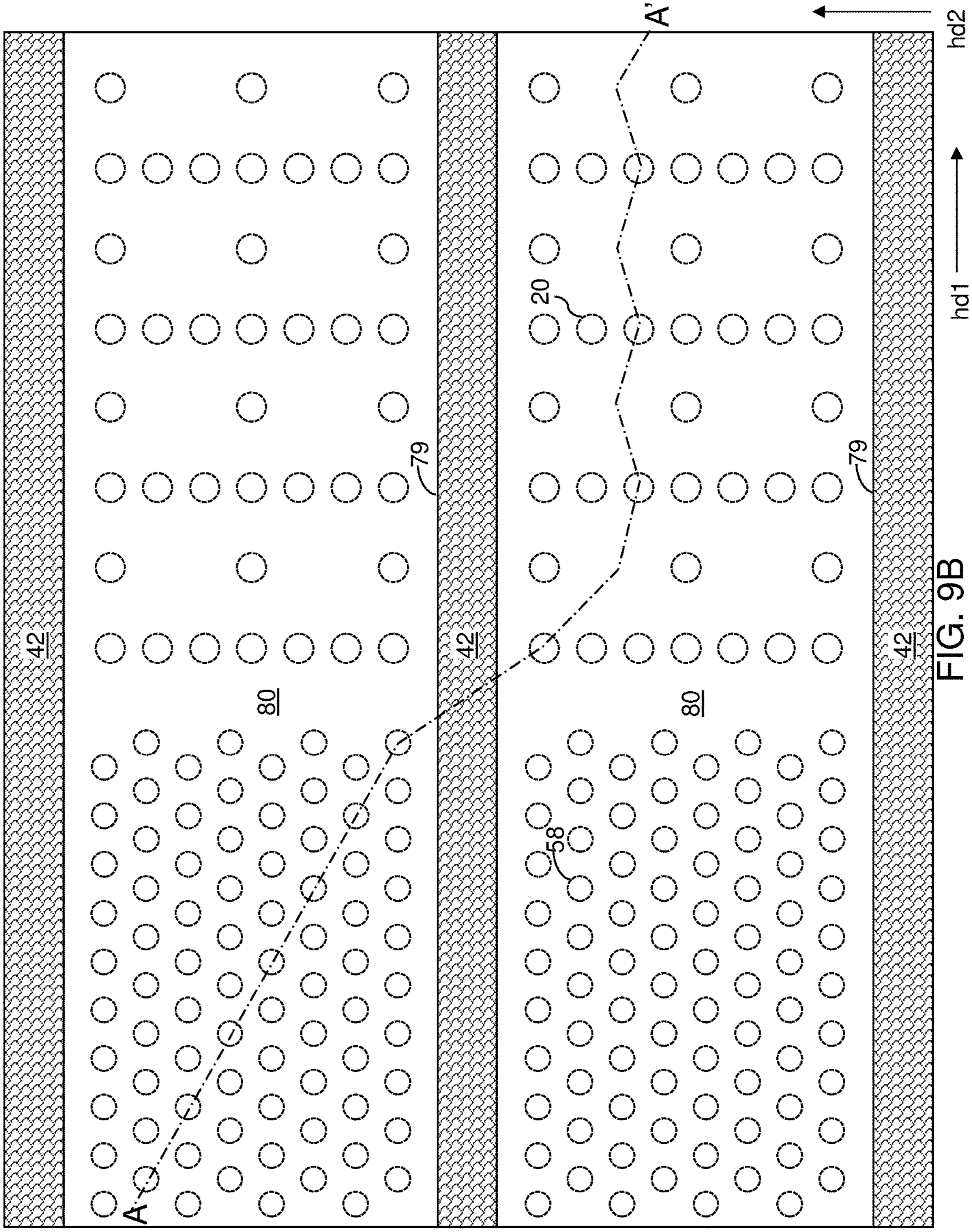
FIG. 9B is a top-down view of the exemplary structure of FIG. 9A. The vertical plane A-A is the cut plane of the vertical cross-sectional view of FIG. 9A.

Referring to FIGS. 9A and 9B, a dielectric material, such as undoped silicate glass (i.e., silicon oxide) or a doped silicate glass can be deposited over the alternating stack (32, 42) to form a contact-level dielectric layer 80. The thickness of the contact-level dielectric layer 80 may be in a range from 100 nm to 600 nm, such as from 200 nm to 400 nm, although lesser and greater thicknesses may also be employed.

A photoresist layer (not shown) can be applied over the contact-level dielectric layer 80, and can be lithographically patterned to form elongated openings that laterally extend along the first horizontal direction hd1 between neighboring clusters of memory opening fill structures 58. An anisotropic etch process can be performed to transfer the pattern of the openings in the photoresist layer through the contact-level dielectric layer 80, the alternating stack (32, 42), and the stepped dielectric material portion 65, and to a top surface of the carrier substrate 9. Lateral isolation trenches 79 laterally extending along the first horizontal direction hd1 can be formed through the alternating stack (32, 42), the stepped dielectric material portion 65, and the contact-level dielectric layer 80. Each of the lateral isolation trenches 79 may comprise a respective pair of lengthwise sidewalls that are parallel to the first horizontal direction hd1 and vertically extend from the top surface of the contact-level dielectric layer 80 to the top surface of the carrier substrate 9. A surface of the carrier substrate 9 can be physically exposed underneath each lateral isolation trench 79. The photoresist layer can be subsequently removed, for example, by ashing.

Figure 10:
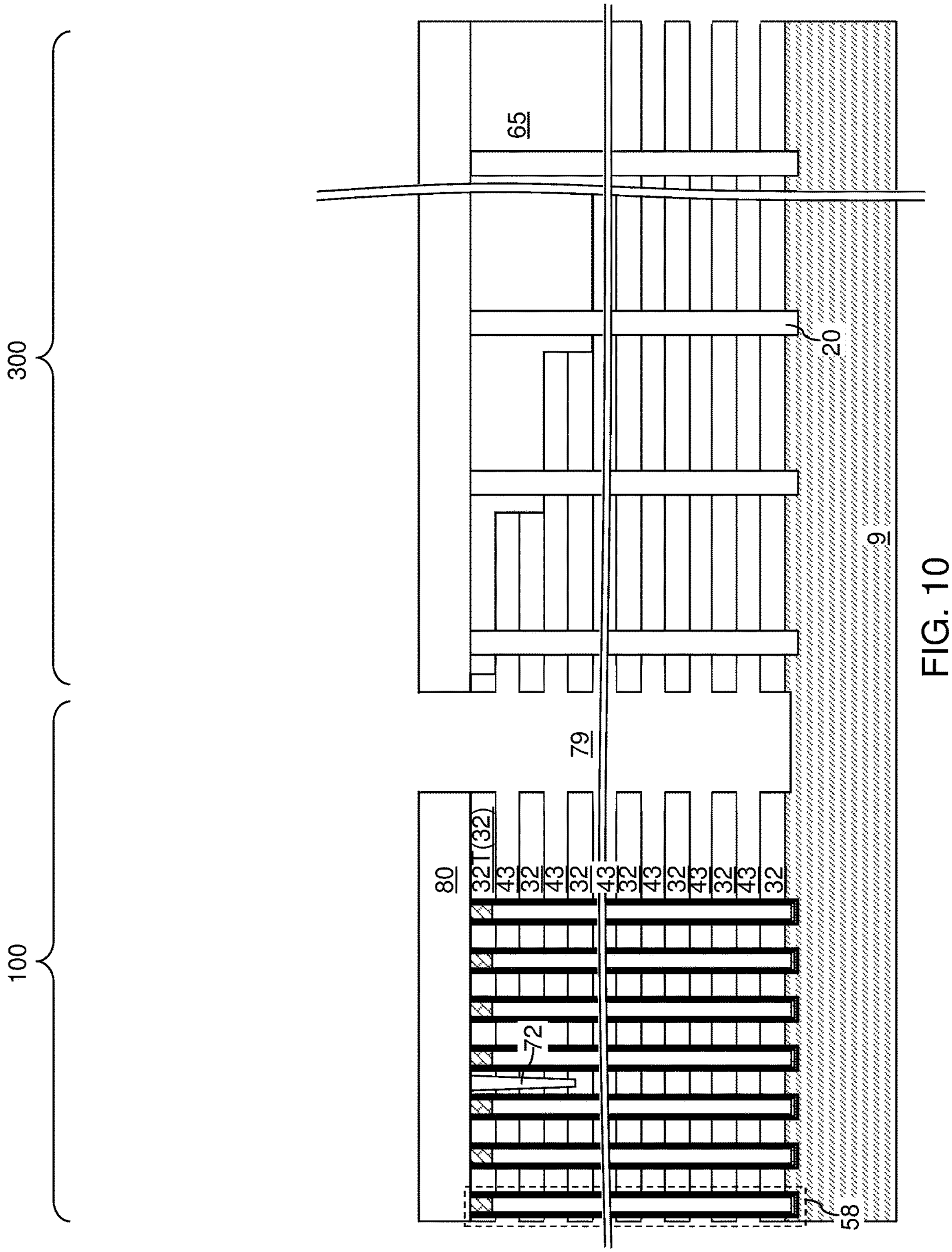
FIG. 10 is a vertical cross-sectional view of the exemplary structure after formation of laterally-extending cavities according to an embodiment of the present disclosure.

Referring to FIG. 10, an etchant that selectively etches the material of the sacrificial material layers 42 with respect to the material of the insulating layers 32 can be introduced into the lateral isolation trenches 79, for example, employing an isotropic etch process. Lateral recesses 43 are formed in volumes from which the sacrificial material layers 42 are removed. The removal of the sacrificial material layers 42 can be selective to the materials of the insulating layers 32, the stepped dielectric material portion 65, and the material of the outermost layer of the memory films 50. In one embodiment, the sacrificial material layers 42 can include silicon nitride, and the materials of the insulating layers 32 and the stepped dielectric material portion 65 can include silicon oxide.

The etch process that removes the second material selective to the first material and the outermost layer of the memory films 50 can be a wet etch process employing a wet etch solution, or can be a gas phase (dry) etch process in which the etchant is introduced in a vapor phase into the lateral isolation trenches 79. For example, if the sacrificial material layers 42 include silicon nitride, the etch process can be a wet etch process in which the exemplary structure is immersed within a wet etch tank including phosphoric acid, which etches silicon nitride selective to silicon oxide, silicon, and various other materials employed in the art. The support pillar structure 20, the stepped dielectric material portion 65, and the memory stack structures 55 provide structural support while the lateral recesses 43 are present within volumes previously occupied by the sacrificial material layers 42.

Each lateral recess 43 can be a laterally extending cavity having a lateral dimension that is greater than the vertical extent of the cavity. In other words, the lateral dimension of each lateral recess 43 can be greater than the height of the lateral recess 43. A plurality of lateral recesses 43 can be formed in the volumes from which the second material of the sacrificial material layers 42 is removed. The memory openings in which the memory stack structures 55 are formed are herein referred to as front side openings or front side cavities in contrast with the lateral recesses 43.

Each of the plurality of lateral recesses 43 can extend substantially parallel to the top surface of the carrier substrate 9. A lateral recess 43 can be vertically bounded by a top surface of an underlying insulating layer 32 and a bottom surface of an overlying insulating layer 32. In one embodiment, each lateral recess 43 can have a uniform height throughout.

Figure 11:
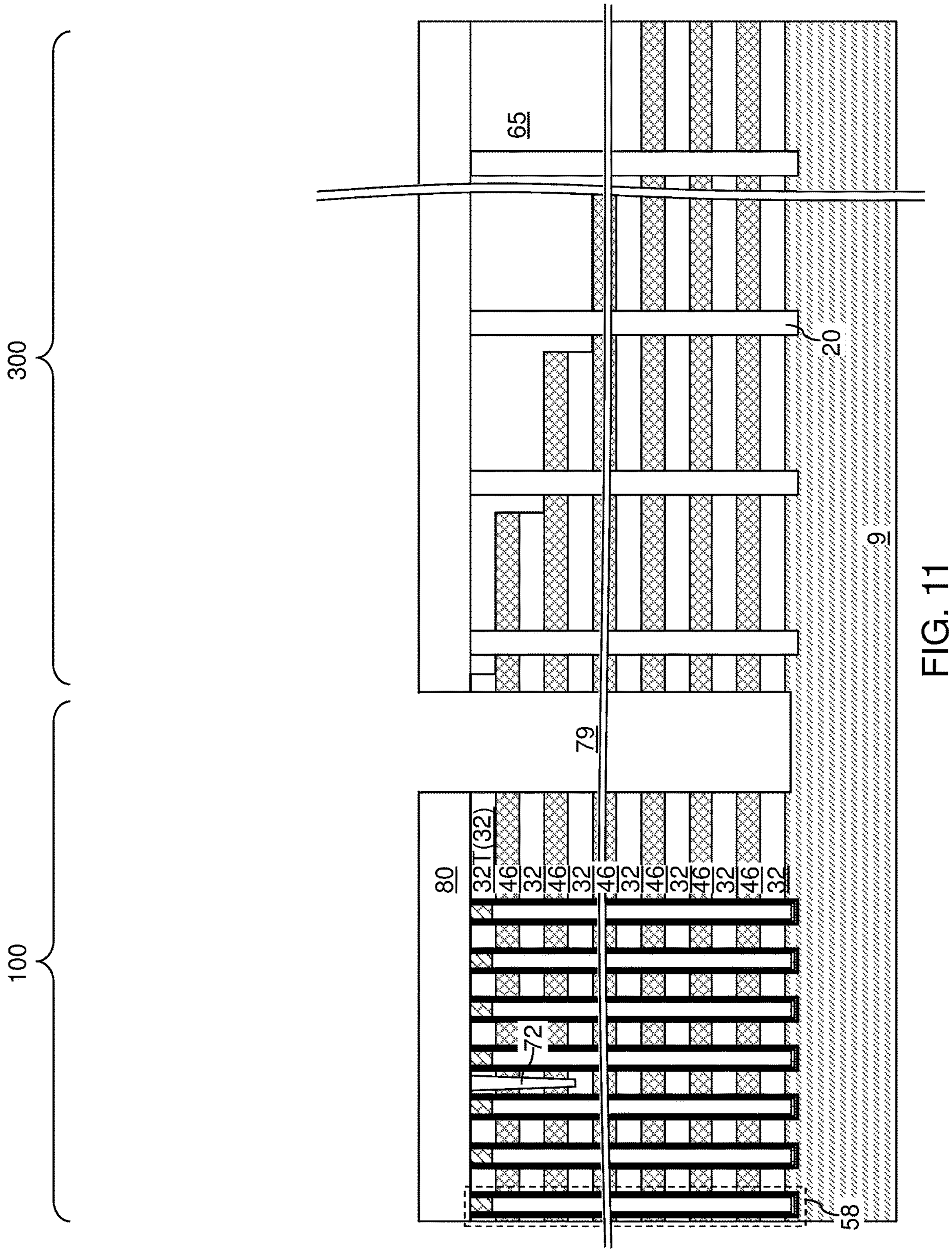
FIG. 11 is a schematic vertical cross-sectional view of the exemplary structure after formation of electrically conductive layers according to an embodiment of the present disclosure.

Referring to FIG. 11, an outer blocking dielectric layer (not expressly illustrated) can be optionally formed. The outer blocking dielectric layer, if present, comprises a dielectric material that functions as a control gate dielectric for the control gates to be subsequently formed in the lateral recesses 43. In case the blocking dielectric layer 52 is present within each memory opening, the outer blocking dielectric layer is optional. In case the blocking dielectric layer 52 is omitted, the outer blocking dielectric layer is present.

At least one conductive material can be deposited in the lateral recesses 43 by providing at least one reactant gas into the lateral recesses 43 through the lateral isolation trenches 79. A metallic barrier layer can be deposited in the lateral recesses 43. The metallic barrier layer includes an electrically conductive metallic material that can function as a diffusion barrier layer and/or adhesion promotion layer for a metallic fill material to be subsequently deposited. The metallic barrier layer can include a conductive metallic nitride material such as TiN, TaN, WN, or a stack thereof, or can include a conductive metallic carbide material such as TiC, TaC, WC, or a stack thereof. In one embodiment, the metallic barrier layer can be deposited by a conformal deposition process such as chemical vapor deposition (CVD) or atomic layer deposition (ALD). The thickness of the metallic barrier layer can be in a range from 2 nm to 8 nm, such as from 3 nm to 6 nm, although lesser and greater thicknesses can also be employed. In one embodiment, the metallic barrier layer can consist essentially of a conductive metal nitride such as TiN.

A metal fill material is deposited in the plurality of lateral recesses 43, on the sidewalls of the at least one the lateral isolation trench 79, and over the top surface of the contact-level dielectric layer 80 to form a metallic fill material layer. The metallic fill material can be deposited by a conformal deposition method, which can be, for example, chemical vapor deposition (CVD), atomic layer deposition (ALD), electroless plating, electroplating, or a combination thereof. In one embodiment, the metallic fill material layer can consist essentially of at least one elemental metal. The at least one elemental metal of the metallic fill material layer can be selected, for example, from tungsten, cobalt, ruthenium, titanium, and tantalum. In one embodiment, the metallic fill material layer can consist essentially of a single elemental metal. In one embodiment, the metallic fill material layer can be deposited employing a fluorine-containing precursor gas such as $WF_6$. In one embodiment, the metallic fill material layer can be a tungsten layer including a residual level of fluorine atoms as impurities. The metallic fill material layer is spaced from the insulating layers 32 and the memory stack structures 55 by the metallic barrier layer, which is a metallic barrier layer that blocks diffusion of fluorine atoms therethrough.

A plurality of electrically conductive layers 46 can be formed in the plurality of lateral recesses 43, and a continuous metallic material layer can be formed on the sidewalls of each lateral isolation trench 79 and over the contact-level dielectric layer 80. Each electrically conductive layer 46 includes a portion of the metallic barrier layer and a portion of the metallic fill material layer that are located between a vertically neighboring pair of dielectric material layers such as a pair of insulating layers 32. The continuous metallic material layer includes a continuous portion of the metallic barrier layer and a continuous portion of the metallic fill material layer that are located in the lateral isolation trenches 79 or above the contact-level dielectric layer 80.

The deposited metallic material of the continuous electrically conductive material layer is etched back from the sidewalls of each lateral isolation trench 79 and from above the contact-level dielectric layer 80 by performing an isotropic etch process that etches the at least one conductive material of the continuous electrically conductive material layer. Each remaining portion of the deposited metallic material in the lateral recesses 43 constitutes an electrically conductive layer 46. Each electrically conductive layer 46 can be a conductive line structure. Thus, the sacrificial material layers 42 are replaced with the electrically conductive layers 46. Generally, the electrically conductive layers 46 can be formed by providing a metallic precursor gas into the lateral isolation trenches 79 and into the lateral recesses 43.

At least one uppermost electrically conductive layer 46 may comprise a drain side select gate electrode. At least one bottommost electrically conductive layer 46 may comprise a source side select gate electrode. The remaining electrically conductive layers 46 may comprise word lines. Each word line functions as a common control gate electrode for the plurality of vertical NAND strings (e.g., memory opening fill structures 58).

Figure 12A:
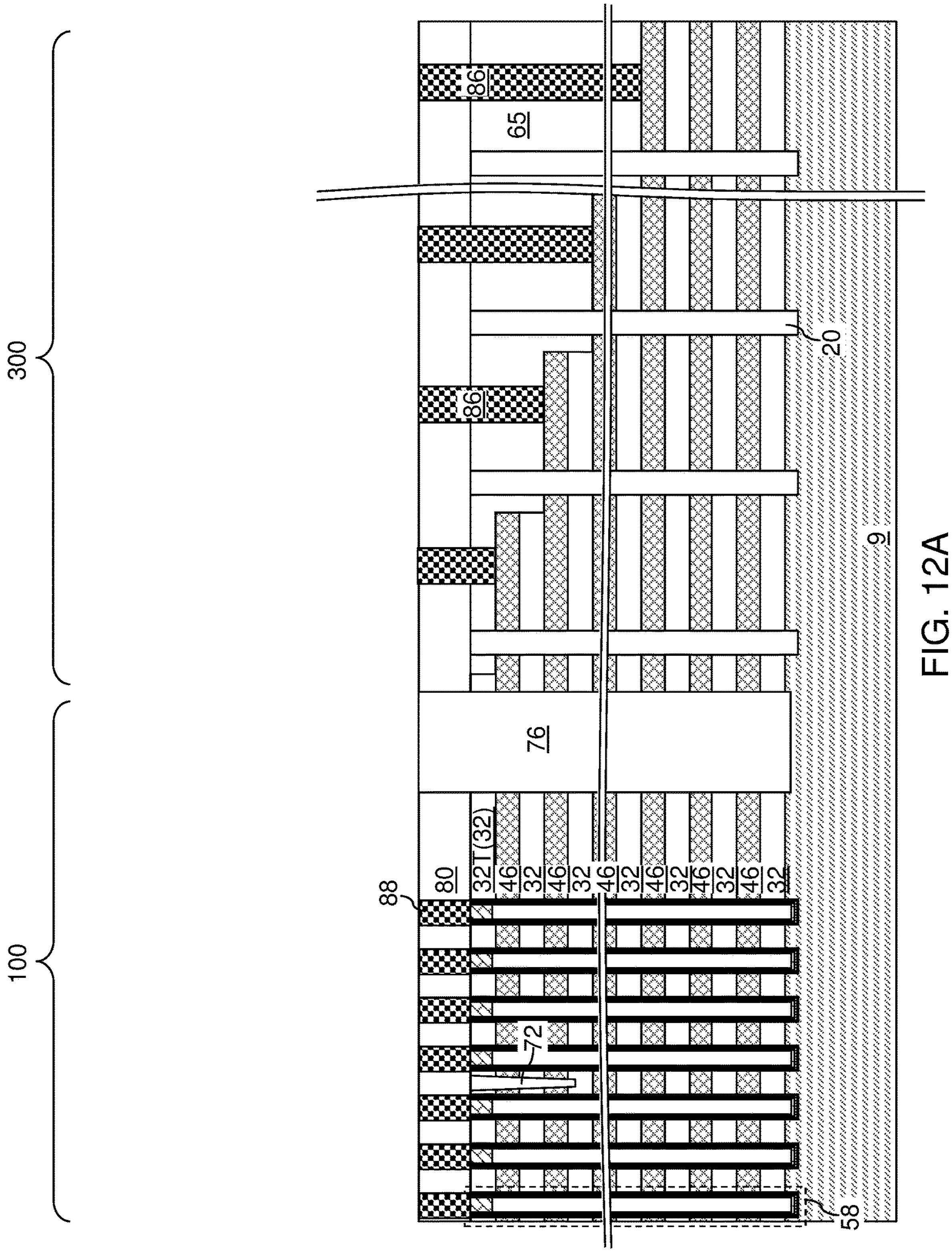
FIG. 12A is a vertical cross-sectional view of the exemplary structure after formation of lateral isolation trench fill structures, layer contact via structures, and drain contact via structures according to an embodiment of the present disclosure.
Figure 12B:
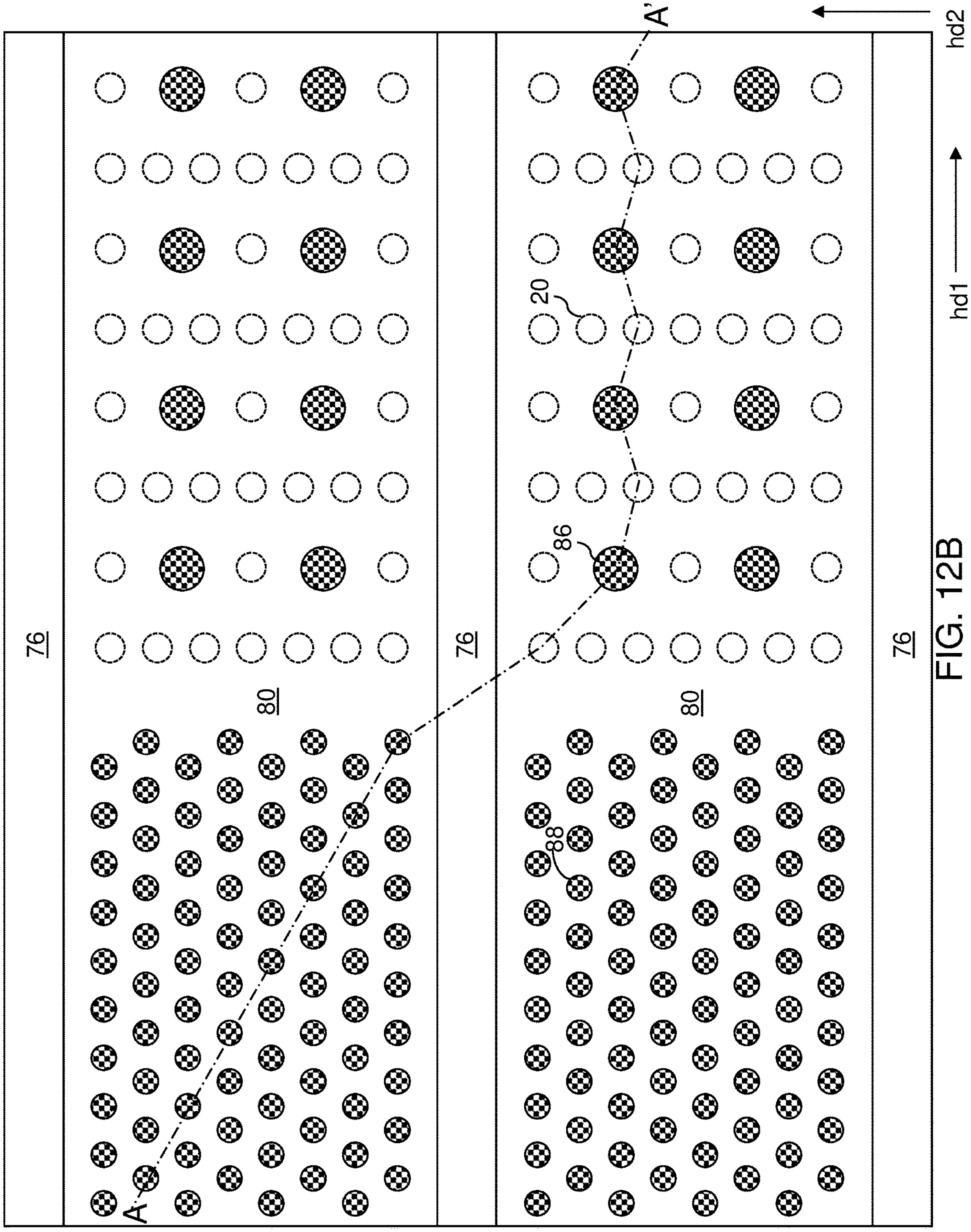
FIG. 12B is a top-down view of the exemplary structure of FIG. 12A. The vertical plane A-A is the cut plane of the vertical cross-sectional view of FIG. 12A.

Referring to FIGS. 12A and 12B, a dielectric fill material, such as silicon oxide can be deposited in the lateral isolation trenches 79. Excess portions of the dielectric fill material can be removed from above the contact-level dielectric layer 80. Each remaining portion of the dielectric fill material that fills a respective one of the lateral isolation trenches 79 constitutes a lateral isolation trench fill structure 76, which may be a dielectric wall structure. In an alternative embodiment, an insulating spacer having a tubular configuration can be formed in peripheral portions of each of the lateral isolation trenches 79, and a through-stack conductive via structure may be formed within a respective one of the insulating spacers. In this case, each lateral isolation trench fill structure 76 may comprise a combination of a through-stack conductive via structure and an insulating spacer that laterally surrounds the through-stack conductive via structure.

Contact via structures (88, 86) can be formed through the contact-level dielectric layer 80, and optionally through the stepped dielectric material portion 65. For example, drain contact via structures 88 can be formed through the contact-level dielectric layer 80 on each drain region 63. Layer contact via structures 86 can be formed on the electrically conductive layers 46 through the contact-level dielectric layer 80, and through the stepped dielectric material portion 65.

Figure 13:
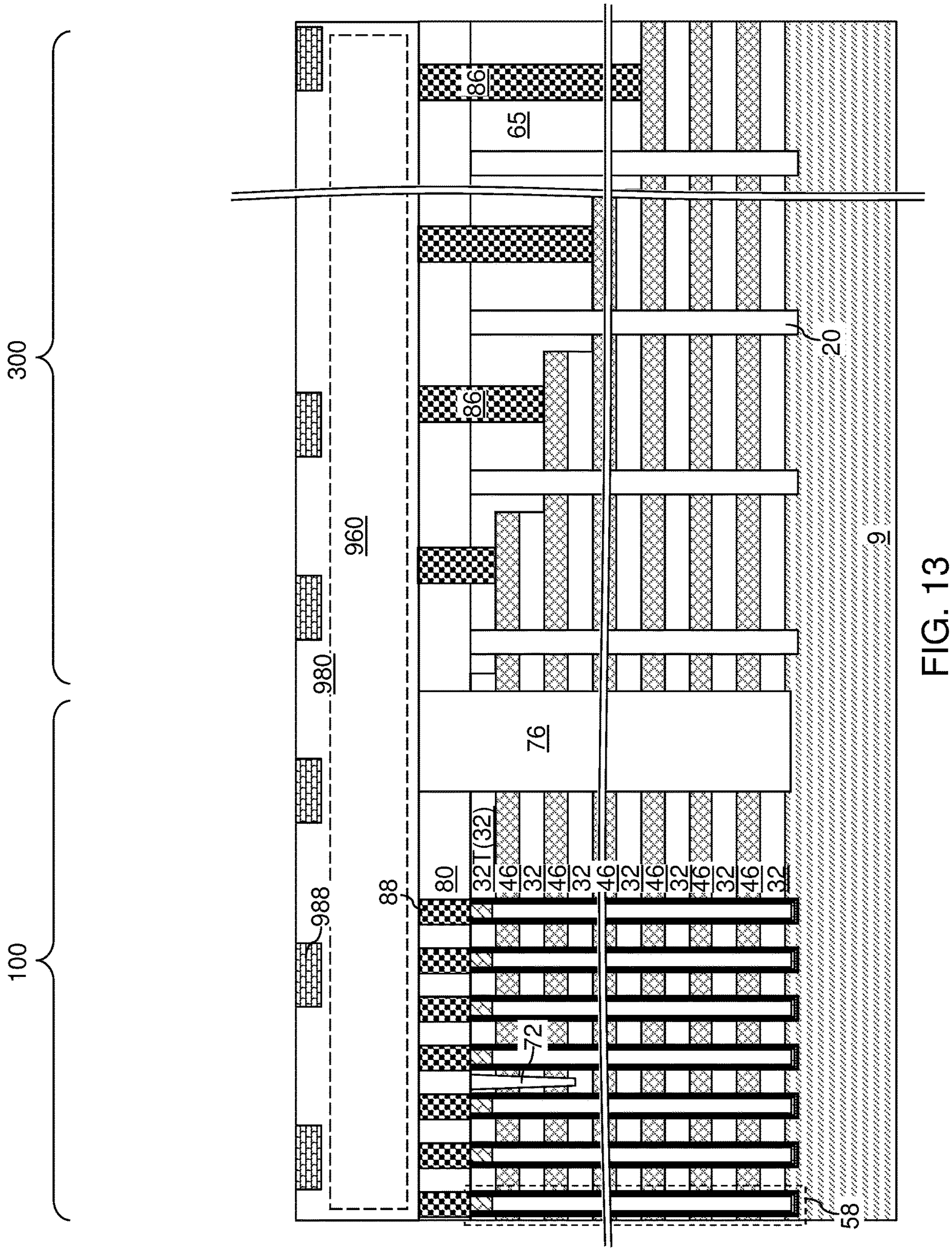
FIG. 13 is a vertical cross-sectional view of the exemplary structure after formation of a memory die according to an embodiment of the present disclosure.

Referring to FIG. 13, additional dielectric material layers and additional metal interconnect structures can be formed over the contact-level dielectric layer 80. The additional dielectric material layers may include at least one via-level dielectric layer, at least one additional line-level dielectric layer, and/or at least one additional line-and-via-level dielectric layer. The additional metal interconnect structures may comprise metal via structures, metal line structures, and/or integrated metal line-and-via structures. The additional dielectric material layers that are formed above the contact-level dielectric layer 80 are herein referred to as memory-side dielectric material layers 960. The additional metal interconnect structures are collectively referred to as memory-side dielectric material layers 960. The memory-side dielectric material layers 960 comprise a bit-line-level dielectric material layer embedding bit lines, which are a subset of the memory-side metal interconnect structures 980.

Metal bonding pads, which are herein referred to memory-side bonding pads 988, may be formed at the topmost level of the memory-side dielectric material layers 960. The memory-side bonding pads 988 may be electrically connected to the memory-side metal interconnect structures 980 and various nodes of the three-dimensional memory array including the electrically conductive layers 46 and the memory opening fill structures 58. A memory die 900 can thus be provided.

The memory-side dielectric material layers 960 are formed over the alternating stacks (32, 46). The memory-side metal interconnect structures 980 are embedded in the memory-side dielectric material layers 960. The memory-side bonding pads 988 can be embedded within the memory-side dielectric material layers 960, and specifically, within the topmost layer among the memory-side dielectric material layers 960. The memory-side bonding pads 988 can be electrically connected to the memory-side metal interconnect structures 980.

In one embodiment, the memory die 900 may comprise: a three-dimensional memory array underlying the first dielectric material layer 110 and comprising an alternating stack (32, 46) of insulating layers 32 and electrically conductive layers 46, a two-dimensional array of memory openings 49 vertically extending through the alternating stack (32, 46), and a two-dimensional array of memory opening fill structures 58 located in the two-dimensional array of memory openings 49 and comprising a respective vertical stack of memory elements and a respective vertical semiconductor channel 60; and a two-dimensional array of contact via structures (such as the drain contact via structures 88) overlying the three-dimensional memory array and electrically connected to a respective one of the vertical semiconductor channels 60.

Figure 14:
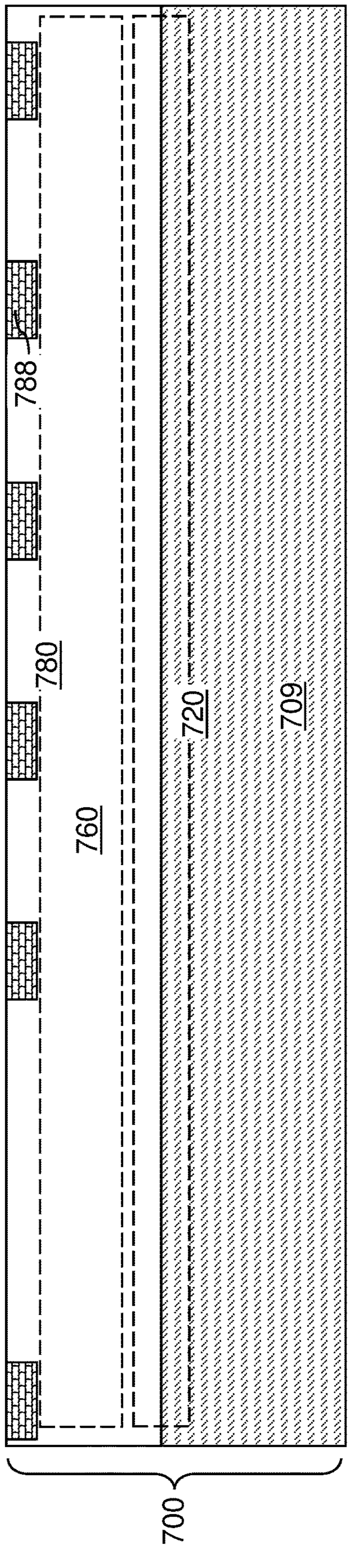
FIG. 14 is a vertical cross-sectional view of a logic die according to an embodiment of the present disclosure.

Referring to FIG. 14, a logic die 700 can be provided. The logic die 700 includes a logic-side substrate 709, a peripheral circuit 720 located on the logic-side substrate 709 and comprising logic-side semiconductor devices (such as field effect transistors), logic-side metal interconnect structures 780 embedded within logic-side dielectric material layers 760, and logic-side bonding pads 788. The peripheral circuit 720 can be configured to control operation of the memory array within the memory die 900. Specifically, the peripheral circuit 720 can be configured to drive various electrical components within the memory array including, but not limited to, the electrically conductive layers 46, the drain regions 63, and a source contact structure to be subsequently formed. The peripheral circuit 720 can be configured to control operation of the vertical stack of memory elements in the memory array in the memory die 900.

Figure 15:
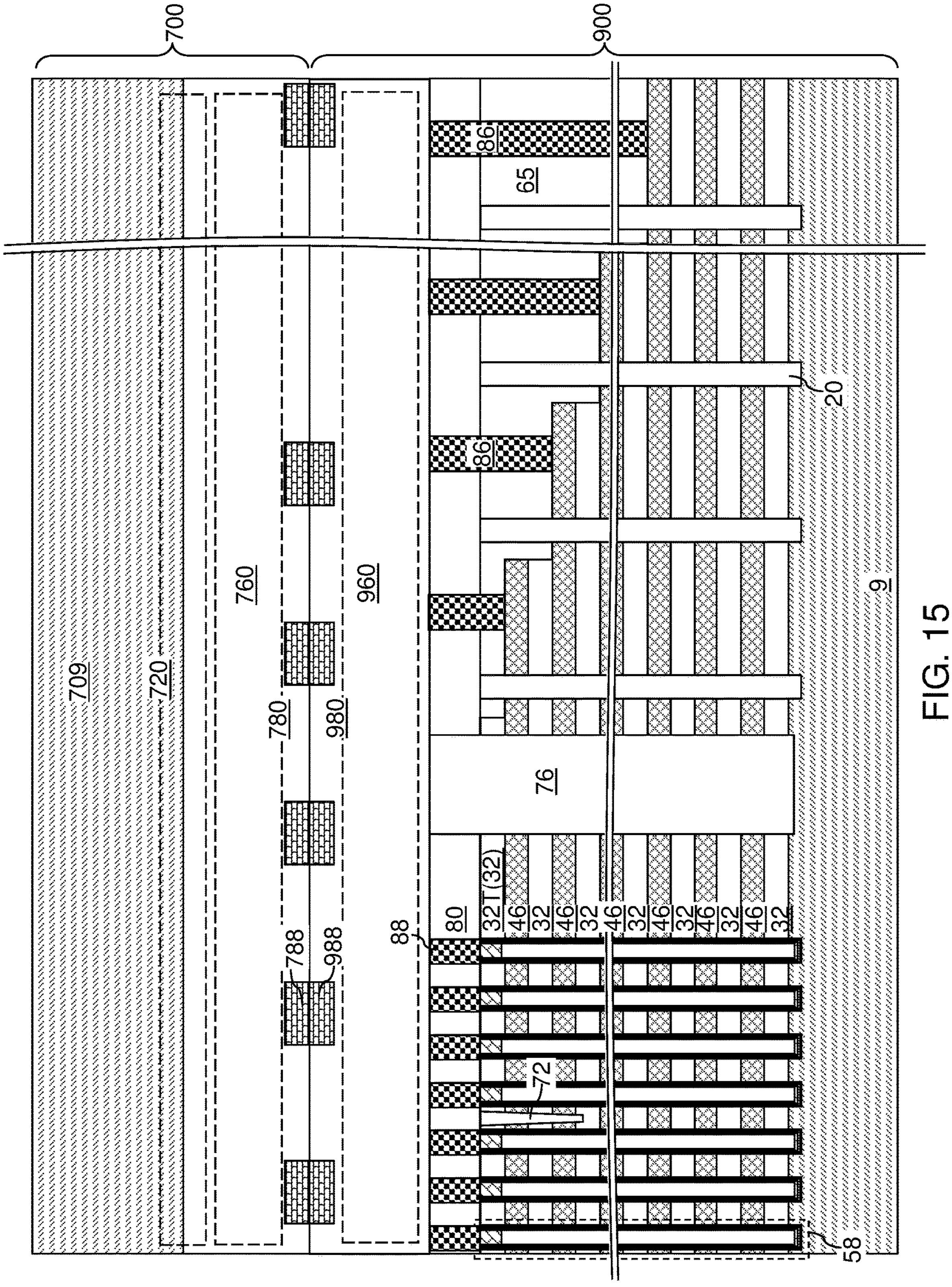
FIG. 15 is a vertical cross-sectional view of the exemplary structure after attaching the logic die to the memory die according to an embodiment of the present disclosure.

Referring to FIG. 15, the logic die 700 can be attached to the memory die 900, for example, by bonding the logic-side bonding pads 788 to the memory-side bonding pads 988 at a bonding interface. The bonding between the memory die 900 and the logic die 700 may be performed employing a wafer-to-wafer bonding process in which a two-dimensional array of memory dies 900 is bonded to a two-dimensional array of logic dies 700, by a die-to-bonding process, or by a die-to-die bonding process. The logic-side bonding pads 788 within each logic die 700 can be bonded to the memory-side bonding pads 988 within a respective memory die 900.

Figure 16A:
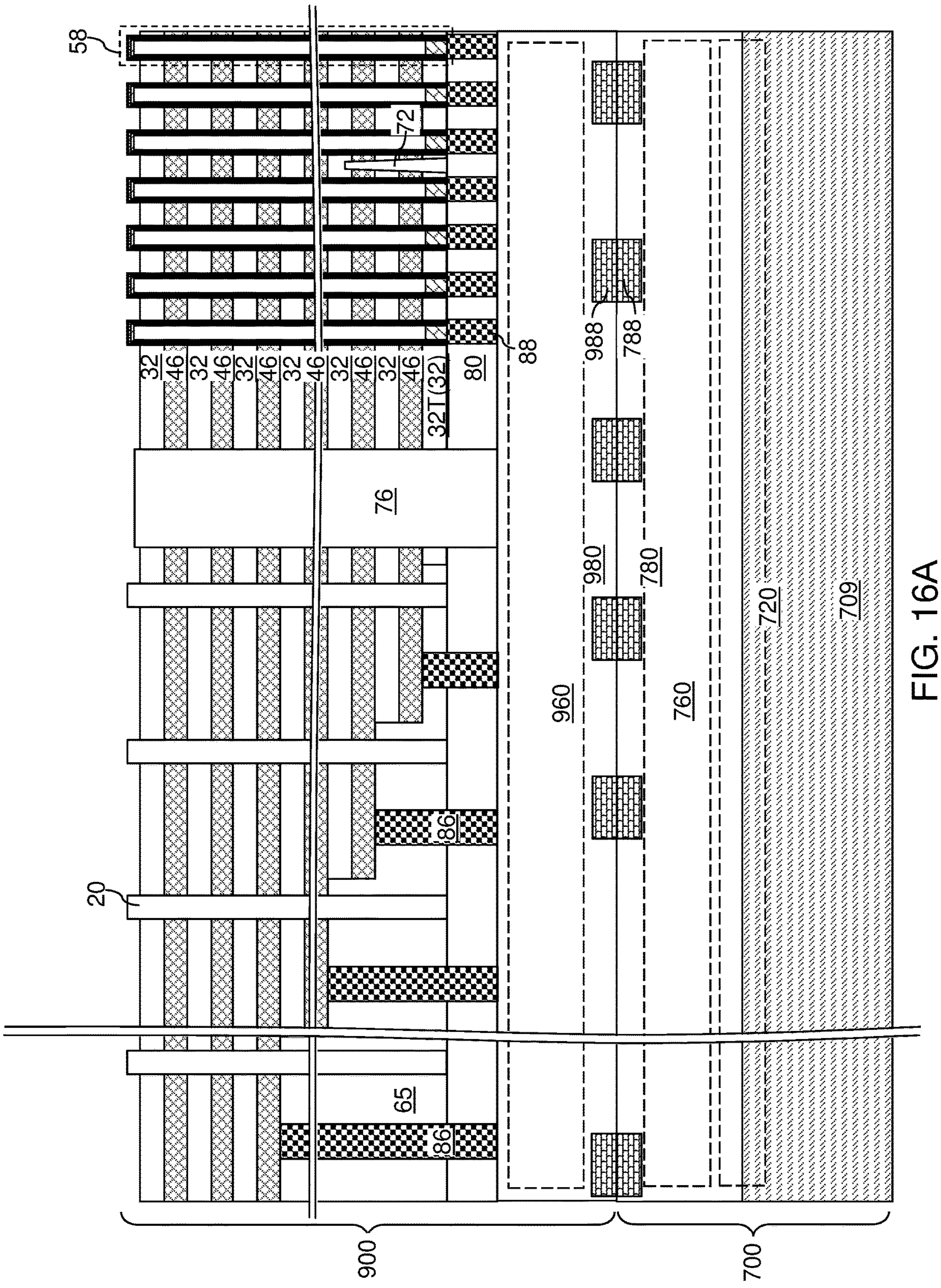
FIG. 16A is a vertical cross-sectional view of the exemplary structure after removal of the carrier substrate according to an embodiment of the present disclosure.
Figure 16B:
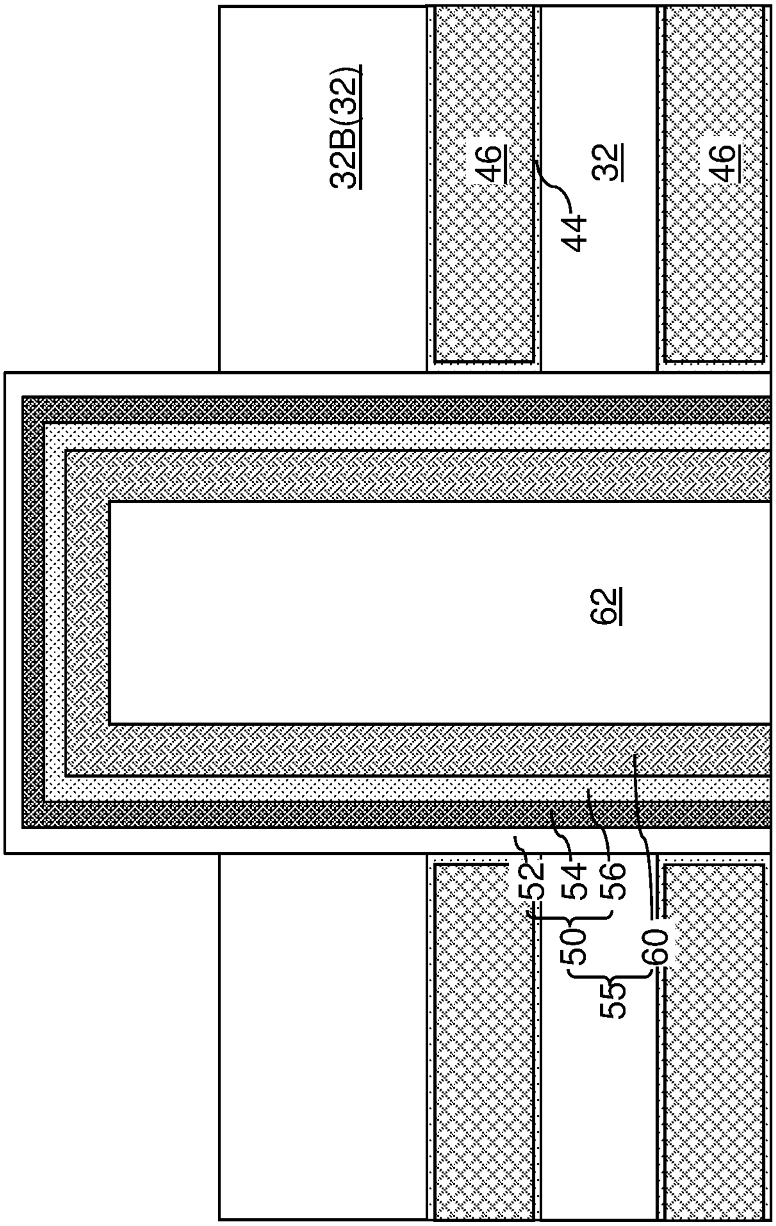
FIG. 16B is a magnified view of a region of the exemplary structure of FIG. 16A.

Referring to FIGS. 16A and 16B, the carrier substrate 9 can be removed, for example, by grinding, polishing, cleaving, an isotropic etch process, an anisotropic etch process, and/or a combination thereof. If a chemical mechanical polishing process or an etch process is employed as a terminal step for removing the carrier substrate 9, the bottommost insulating layer 32B may be employed as a polish stop or etch stop, respectively.

In one embodiment, at least a terminal step of at least one removal process that is employed to remove the carrier substrate 9 may comprise a selective wet etch process that etches the material of the carrier substrate 9 (such as a semiconductor material of the carrier substrate 9) selective to dielectric materials of the memory films 50. In an illustrative example, if the carrier substrate 9 comprises a semiconductor material, the terminal step of the at least one removal process may comprise a wet etch process using hot trimethyl-2 hydroxyethyl ammonium hydroxide ("hot TMY") or tetramethyl ammonium hydroxide (TMAH). The entirety of the carrier substrate 9 can be removed by the selective wet etch process. Backside end surfaces of the support pillar structures 20 can be physically exposed upon removal of the carrier substrate 9. The optional outer blocking dielectric layers 44 are illustrated in FIG. 16B, each of which embeds a respective electrically conductive layer 46. Alternatively, the optional outer blocking dielectric layers 44 may be omitted.

FIGS. 17A-17E are sequential vertical cross-sectional views of a region of a first configuration of the exemplary structure during formation of a polycrystalline germanium-containing semiconductor layer 22C according to the first embodiment of the present disclosure.

Figure 17A:
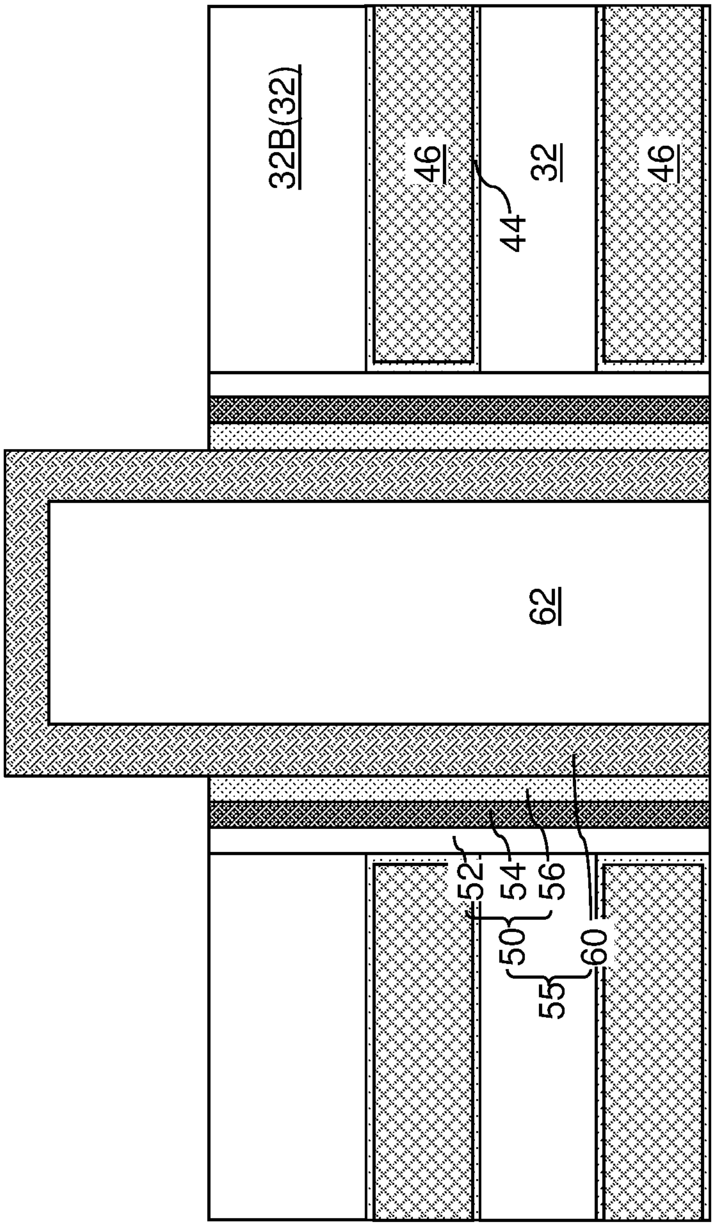
FIGS. 17A-17E are sequential vertical cross-sectional views of a region of a first configuration of the exemplary structure during formation of a polycrystalline germanium-containing semiconductor layer according to a first embodiment of the present disclosure.

Referring to FIG. 17A, an end portion of each memory film 50 may be removed by performing a sequence of wet etch processes. In one embodiment, the sequence of wet etch processes may comprise a first wet etch process that etches the material of the blocking dielectric layer 52 selective to the material of the memory material layer 54, a second wet etch process that etches the material of the memory material layer 54 selective to the material of the dielectric liner 56, and a third wet etch process that etches the material of the dielectric liner 56 selective to the material of the vertical semiconductor channel 60. Upon removal of the end portion of the memory film 50, an end portion of each vertical semiconductor channel 60 may be physically exposed.

Figure 17B:
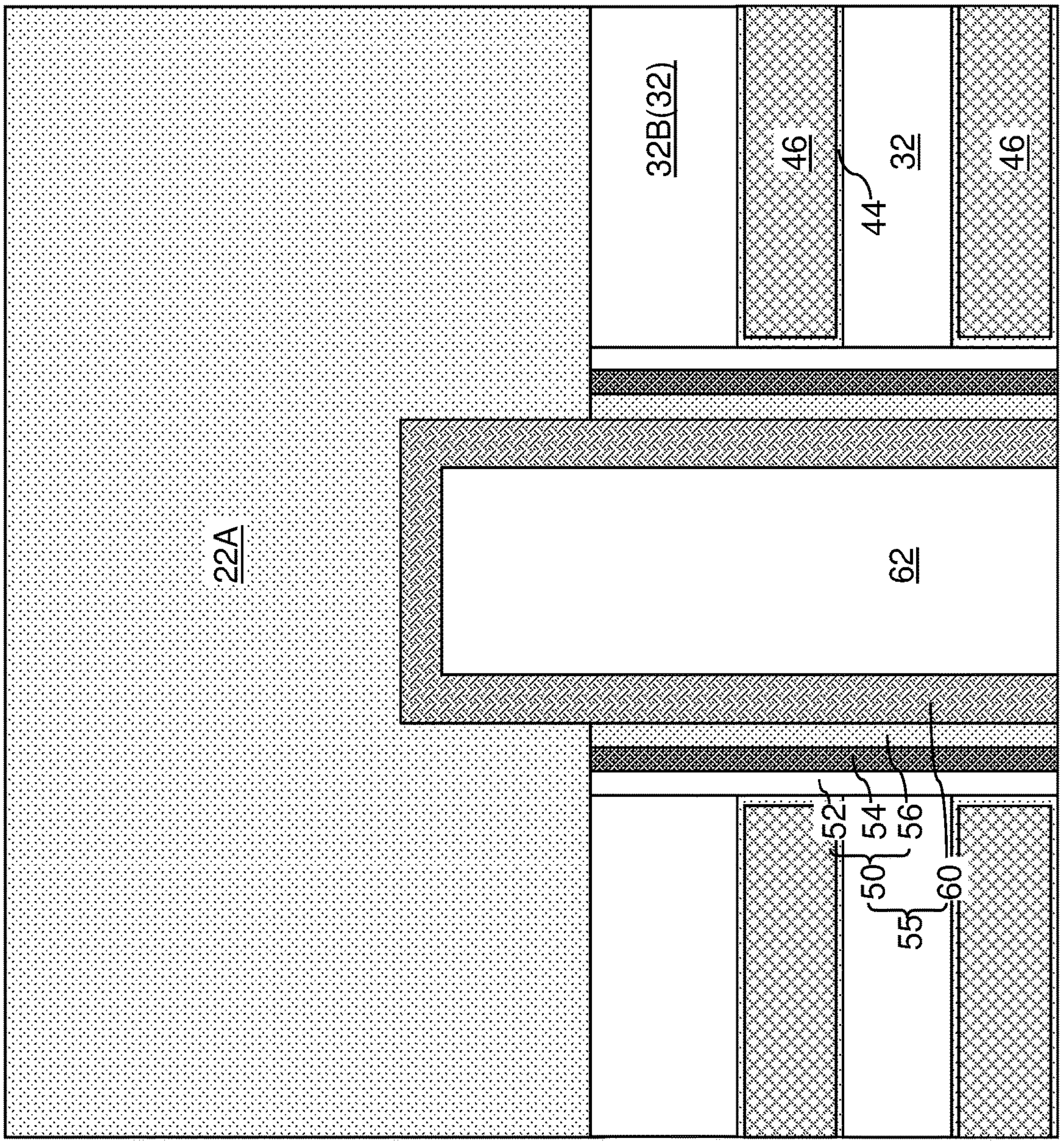

Referring to FIG. 17B, an amorphous germanium-containing semiconductor layer 22A can be formed on a bottom surface of the alternating stack (32, 46) and on the exposed end portion of each vertical semiconductor channel 60. The amorphous germanium-containing semiconductor layer 22A comprises a semiconductor material containing germanium at an atomic percentage greater than 50%, such as an atomic percentage in a range from 60% to 100%, and/or from 70% to 100%. The amorphous germanium-containing semiconductor layer 22A may consist essentially of amorphous germanium, or may comprise silicon at an atomic percentage in a range from 0% to less than 50%, such as from 1% to 40%, and/or from 3% to 30% (i.e., the semiconductor layer 22A may be a silicon-germanium compound semiconductor layer).

The amorphous germanium-containing semiconductor layer 22A may be deposited by any suitable deposition process. For example, amorphous germanium-containing semiconductor layer 22A may be deposited by a low temperature deposition process at a temperature below 425 degrees Celsius, such as a temperature in a range from 250 degrees Celsius to 400 degrees Celsius, to avoid damaging the bonded bonding pads which bond the logic die to the memory die. The low temperature deposition process may comprise a physical vapor deposition process (e.g., sputtering) or a plasma-enhanced chemical vapor deposition process employing at least one germanium hydride precursor gas, such as $GeH_4$, $Ge_2H_6$, and/or $Ge_3H_8$. If the amorphous germanium-containing semiconductor layer 22A is a silicon-germanium compound semiconductor material, a high order silicon-precursor gas, such as $Si_2H_6$, $Si_3H_8$, $Si_4H_{10}$, $SiH(SiH_3)_3$, and/or $Si(SiH_3)_4$ may be employed in addition to the at least one germanium hydride precursor gas during deposition of the amorphous germanium-containing semiconductor layer 22A. The thickness of the amorphous germanium-containing semiconductor layer 22A may be in a range from 30 nm to 300 nm, although lesser and greater thicknesses may also be employed.

The amorphous germanium-containing semiconductor layer 22A may be formed as an intrinsic semiconductor material layer without electrical dopants therein, or may be in-situ doped with dopants of the second conductivity type (e.g., n-type) which is the opposite of the first conductivity type. In one embodiment, electrical dopants of the second conductivity type (e.g., phosphorus and/or arsenic) can be implanted into the amorphous germanium-containing semiconductor layer 22A such that an atomic concentration the electrical dopants of the second conductivity type in the amorphous germanium-containing semiconductor layer is in a range from $5.0\times10^{18}/cm^3$ to $2.0\times10^{21}/cm^3$. The ion implantation process may be conducted after the deposition of the amorphous germanium-containing semiconductor layer 22A or after the step shown in FIG. 17E.

Figure 17C:
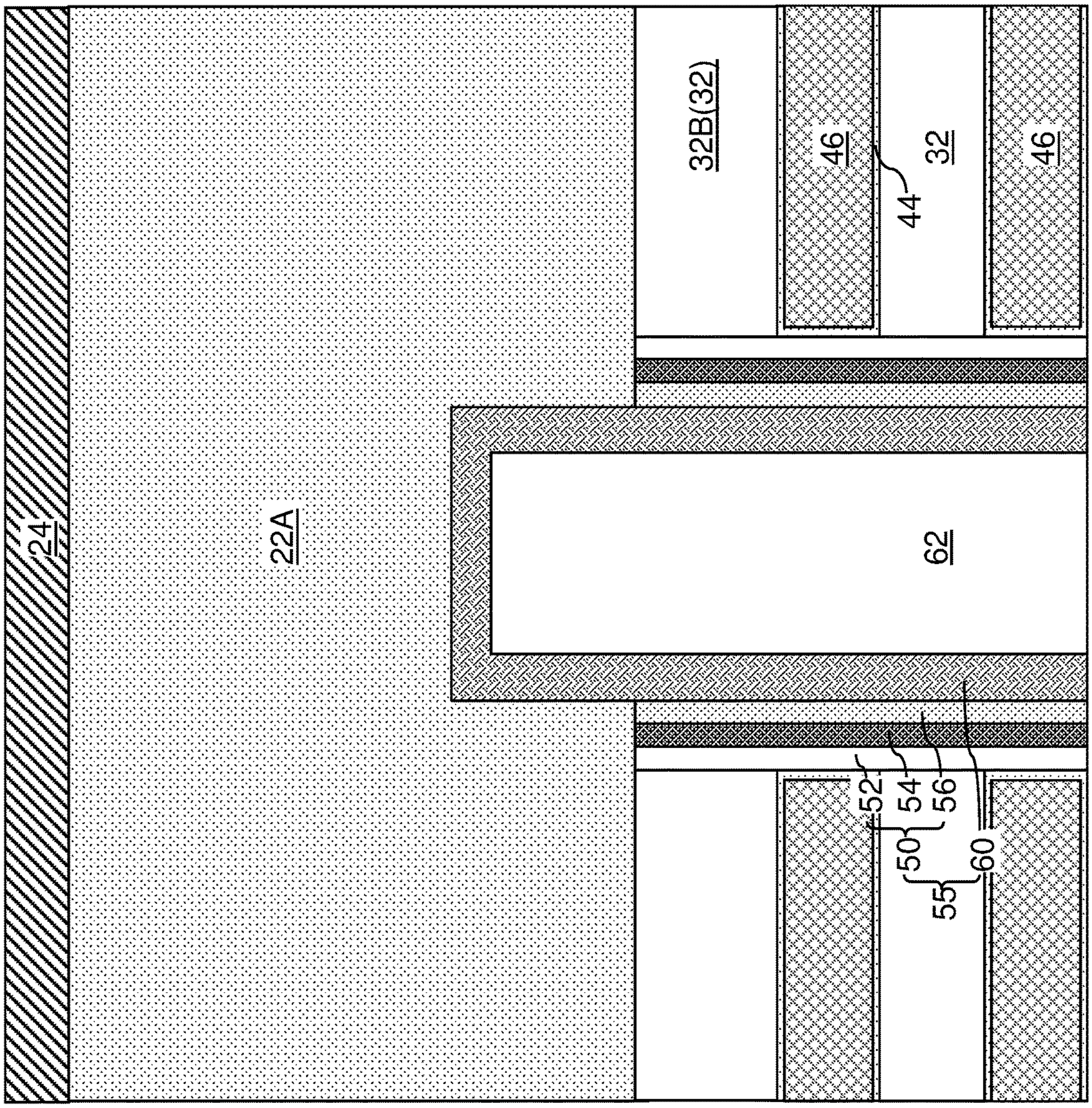

Referring to FIG. 17C, a metal containing layer 24 can be deposited on the amorphous germanium-containing semiconductor layer 22A. The metal containing layer 24 comprises a metal or metal alloy which is capable of inducing metal-induced crystallization (MIC) of the amorphous germanium-containing semiconductor layer 22A at a temperature lower than 425 degrees Celsius, and preferably at a temperature in a range from 200 degrees Celsius to 400 degrees Celsius. In one embodiment, the metal containing layer 24 comprises an elemental metal selected from Au, In, Bi, Pb, Ga, Ag, Al, Sn, Zn, Sb, Fe, Nb, Mg, Mn, Co, Cr, Mo, Zr, Cu, Ni, Pd, Ta, Ti, W, alloys thereof, a germanide thereof or a silicide thereof. For example, the metal containing layer 24 may comprise elemental Ni, Co, Cu, Pd or Fe. The metal containing layer 24 can be deposited by physical vapor deposition. The thickness of the metal containing layer 24 may be in a range from 5 nm to 50 nm, such as from 10 nm to 25 nm, although lesser and greater thicknesses may also be employed.

Figure 17D:
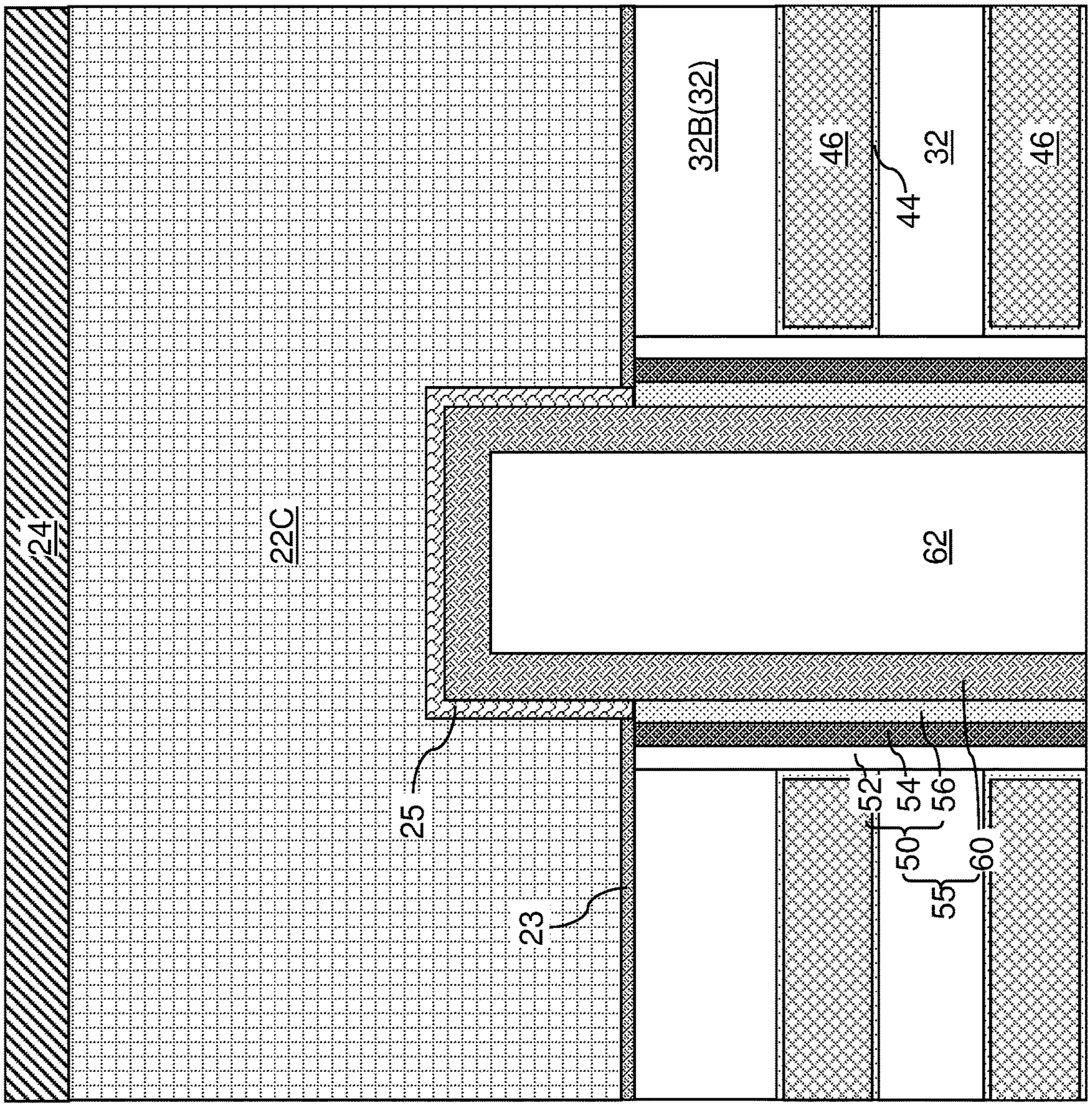

Referring to FIG. 17D, an anneal process is performed at an elevated temperature that indues a metal-induced crystallization process in the amorphous germanium-containing semiconductor layer 22A. The elevated temperature may be in a range from 200 degrees Celsius to 400 degrees Celsius, such as from 300 degrees celcius to 400 degrees Celsius. The duration of the anneal process may be in a range from 1 minute to 120 minutes, although lesser and greater durations may also be employed. The anneal may be a furnace anneal, a rapid thermal anneal (e.g., a flash lamp anneal) and/or a laser anneal. The relatively low temperature of the metal-induced crystallization process does not damage the bonding pads which bond the logic die 700 to the memory die 900.

During the anneal, the metal atoms from the metal containing layer 24 diffuse along a vertical direction through the amorphous germanium-containing semiconductor layer 22A, and leave behind a crystalline germanium trail to convert the amorphous germanium-containing semiconductor layer 22A into a polycrystalline germanium-containing semiconductor layer 22C. Thus the amorphous germanium-containing semiconductor layer 22A is converted into the polycrystalline germanium-containing semiconductor layer 22C by metal-induced crystallization.

In one embodiment, the polycrystalline germanium-containing semiconductor layer 22C comprises columnar grains that extend along the vertical direction from a bottommost surface of the polycrystalline germanium-containing semiconductor layer 22C (i.e., the distal surface that contacts the metal containing layer 24) to a top surface of the polycrystalline germanium-containing semiconductor layer 22C that contacts the alternating stack (32, 46). In one embodiment, a predominant fraction of the grains within the polycrystalline germanium-containing semiconductor layer 22C comprises columnar grains that extend along the vertical direction from a bottommost surface of the polycrystalline germanium-containing semiconductor layer 22C to a top surface of the polycrystalline germanium-containing semiconductor layer 22C. As used herein, a predominant fraction refers to a fraction that is at least 50%, such as 50% to 99%.

In one embodiment, the diffused metal atoms can form an interfacial metal alloy layer 23 between the polycrystalline germanium-containing semiconductor layer 22C and the alternating stack (32, 46). In one embodiment, the interfacial metal alloy layer 23 consists of a metal germanide alloy if the amorphous germanium-containing semiconductor layer 22A included only germanium. For example, the metal germanide alloy may comprise NiGe, $FeGe_2$, CoGe, $Cu_3Ge$ or PdGe. In another embodiment, the interfacial metal alloy layer 23 consists of a metal silicide or a metal silicide-germanide alloy if the amorphous germanium-containing semiconductor layer 22A included a silicon-germanium compound semiconductor material. In one embodiment, the interfacial metal alloy layer 23 may have an average thickness that is less than the thickness of a monolayer of atoms, and includes nanoscale openings therethrough. In one embodiment, the effective average thickness of the interfacial metal alloy layer 23 may be in a range from 0.03 nm to 0.2 nm, such as from 0.05 nm to 0.12 nm, although lesser and greater thicknesses may also be employed. In one embodiment, a memory film 50 is in contact with an interfacial metal alloy layer 23.

Generally, metal-induced crystallization refers to a process in which atoms of a metal facilitate crystallization of a semiconductor material at a lower temperature by inducing crystalline growth than a typical crystallization temperature in the absence of such a metal. The metal-induced crystallization of a germanium-containing semiconductor material can occur at temperatures at or below 400 degrees Celsius for the above listed metals.

In one embodiment, each vertical semiconductor channel 60 comprises silicon at an atomic percentage greater than 90%, such as 95% to 99.9%, and a metal-silicon-germanium alloy layer 25 may be formed between the polycrystalline germanium-containing semiconductor layer 22C and each vertical semiconductor channel 60. In one embodiment, each vertical semiconductor channel 60 comprises a cylindrical surface segment that contacts a cylindrical surface segment of the metal-silicon-germanium alloy layer 25, and a planar surface segment that contacts a planar surface segment of the metal-silicon-germanium alloy layer 25. In one embodiment, each vertical semiconductor channel 60 comprises an outer sidewall that includes a first cylindrical surface segment that contacts a cylindrical surface segment of a metal-silicon-germanium alloy layer 25 and a second cylindrical surface segment that contacts a memory film 50.

In one embodiment, a memory opening fill structure 58 may be located in each memory opening 49. The memory opening fill structure 58 comprises a memory film 50 and a vertical semiconductor channel 60 having an end surface in electrical contact with the polycrystalline germanium-containing semiconductor layer 22C. In one embodiment, the vertical semiconductor channel 60 comprises silicon at an atomic percentage greater than 90%, and a metal-silicon-germanium alloy layer 25 is present between the polycrystalline germanium-containing semiconductor layer 22C and the vertical semiconductor channel 60. In one embodiment, the metal-silicon-germanium alloy layer 25 has a thickness that is less than 20% of a maximum thickness of the vertical semiconductor channel 60. In one embodiment, more than 50% of an entirety of the metal-silicon-germanium alloy layer 25 comprises a metal germanosilicide, such as a Ni, Co, Cu, Pd or Fe germanosilicide. In one embodiment, the thickness of the metal-silicon-germanium alloy layer 25 may be in a range from 0.1 nm to 2 nm, such as from 0.2 nm to 1 nm, although lesser and greater thicknesses may also be employed.

Figure 17E:
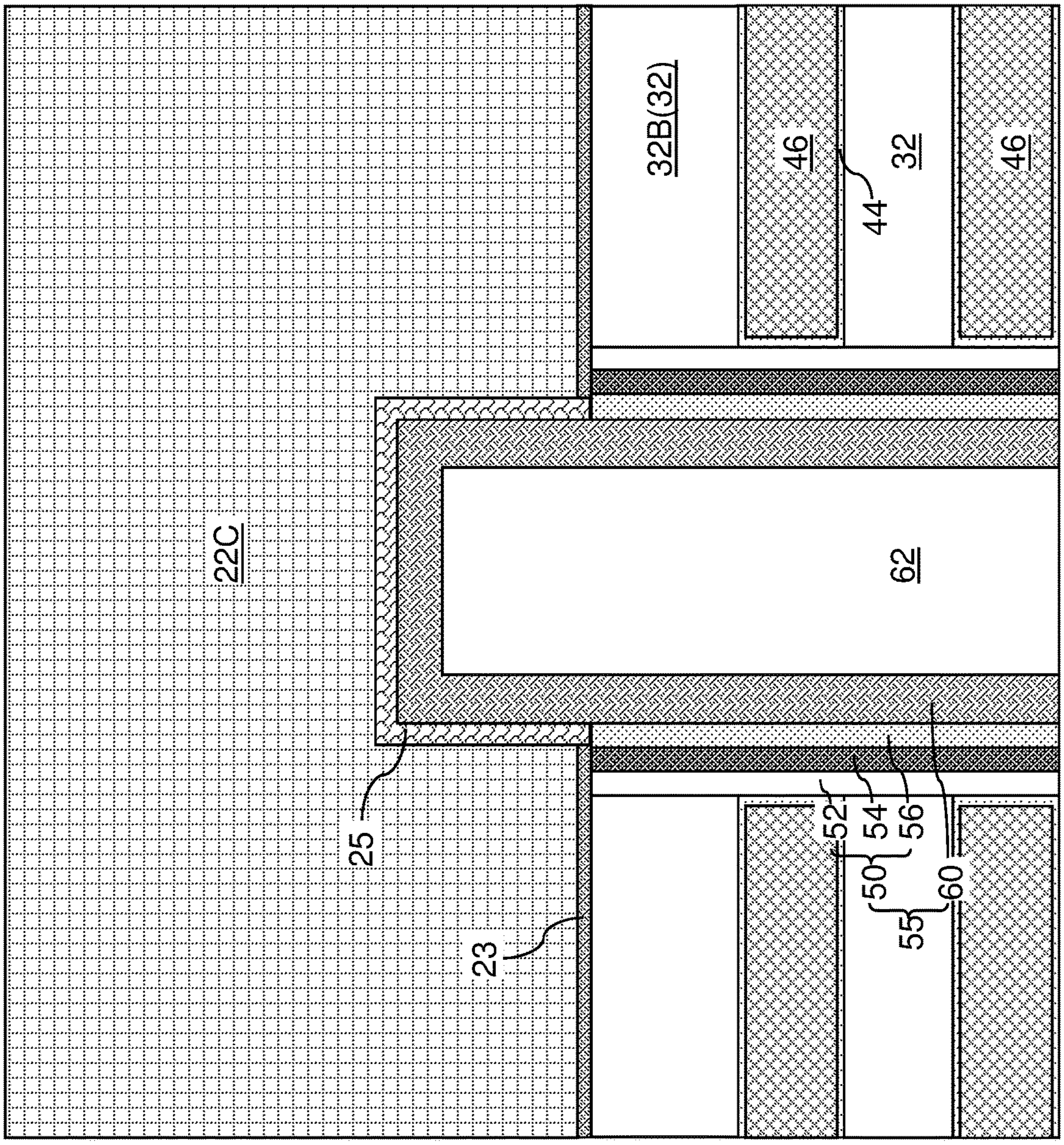

Referring to FIG. 17E, a selective wet etch process can be performed to remove remaining portions of the metal containing layer 24 selective to the polycrystalline germanium-containing semiconductor layer 22C. If the optional second conductivity type dopant ion implantation process is conducted after removing the remaining portion of the metal containing layer 24 shown in FIG. 17E, then the ions of the second conductivity type are implanted into the polycrystalline germanium-containing semiconductor layer 22C. The ion implantation process may be followed by an optional thermal or laser anneal to activate the dopants.

FIGS. 18A-18E are sequential vertical cross-sectional views of a region of a second configuration of the exemplary structure during formation of a polycrystalline germanium-containing semiconductor layer 22C according to the second embodiment of the present disclosure.

Figure 18A:
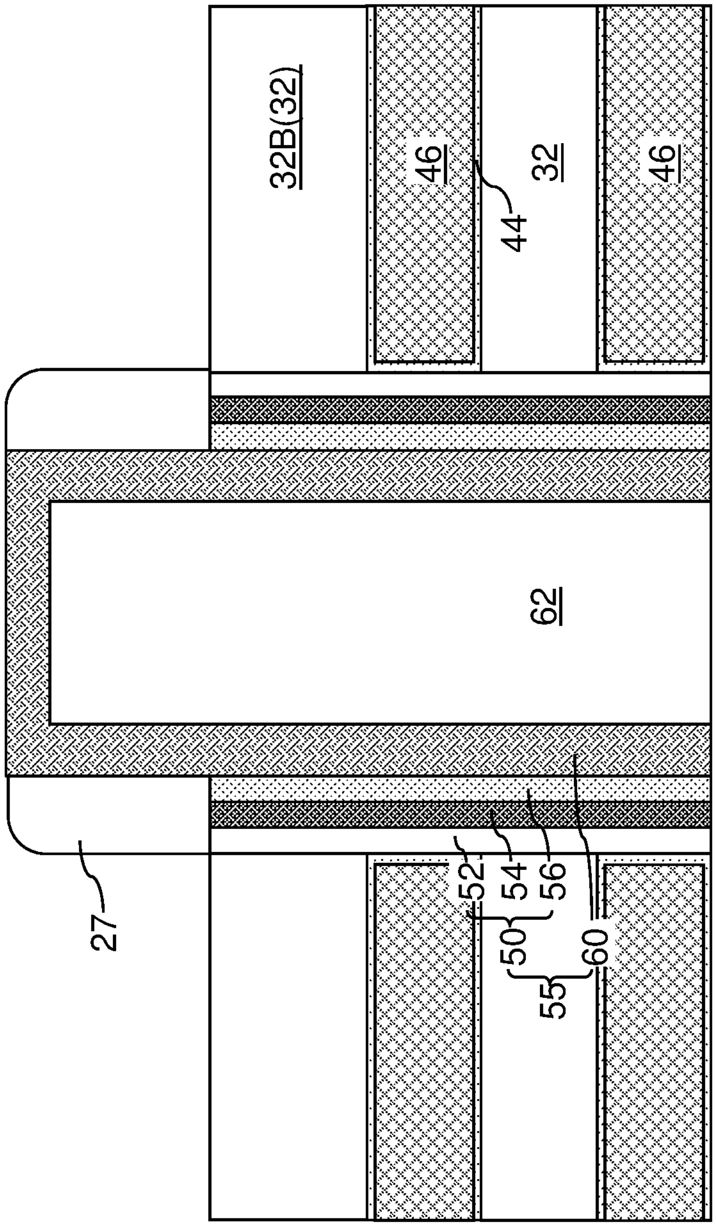
FIGS. 18A-18E are sequential vertical cross-sectional views of a region of a second configuration of the exemplary structure during formation of a polycrystalline germanium-containing semiconductor layer according to a second embodiment of the present disclosure.

Referring to FIG. 18A, the second configuration of the exemplary structure may be derived from the first configuration illustrated in FIG. 17A by forming diffusion barrier 27 on the physically exposed end portion of each vertical semiconductor channel 60. The diffusion barrier 27 may be formed be depositing a diffusion barrier layer on the physically exposed end portions of each vertical semiconductor channel 60. If the diffusion barrier layer comprises an electrically conductive material (e.g., a metal nitride barrier layer, such as TiN, TaN, WN or MON or a diffusion barrier metal, such as Ti or W), then the diffusion barrier 27 may cover the sidewall and the horizontal (i.e., bottom) surface of the physically exposed end portion of each vertical semiconductor channel 60. If the diffusion barrier layer comprises an electrically insulating material, such as silicon oxide, then an anisotropic sidewall spacer etch is performed to remove horizontal portion of the diffusion barrier layer to leave sidewall spacer shaped diffusion barrier 27 only on the sidewall of the physically exposed end portion of each vertical semiconductor channel 60, while the horizontal (i.e., bottom) surface of the physically exposed end portion of each vertical semiconductor channel 60 remains exposed, as shown in FIG. 18A.

Figure 18B:
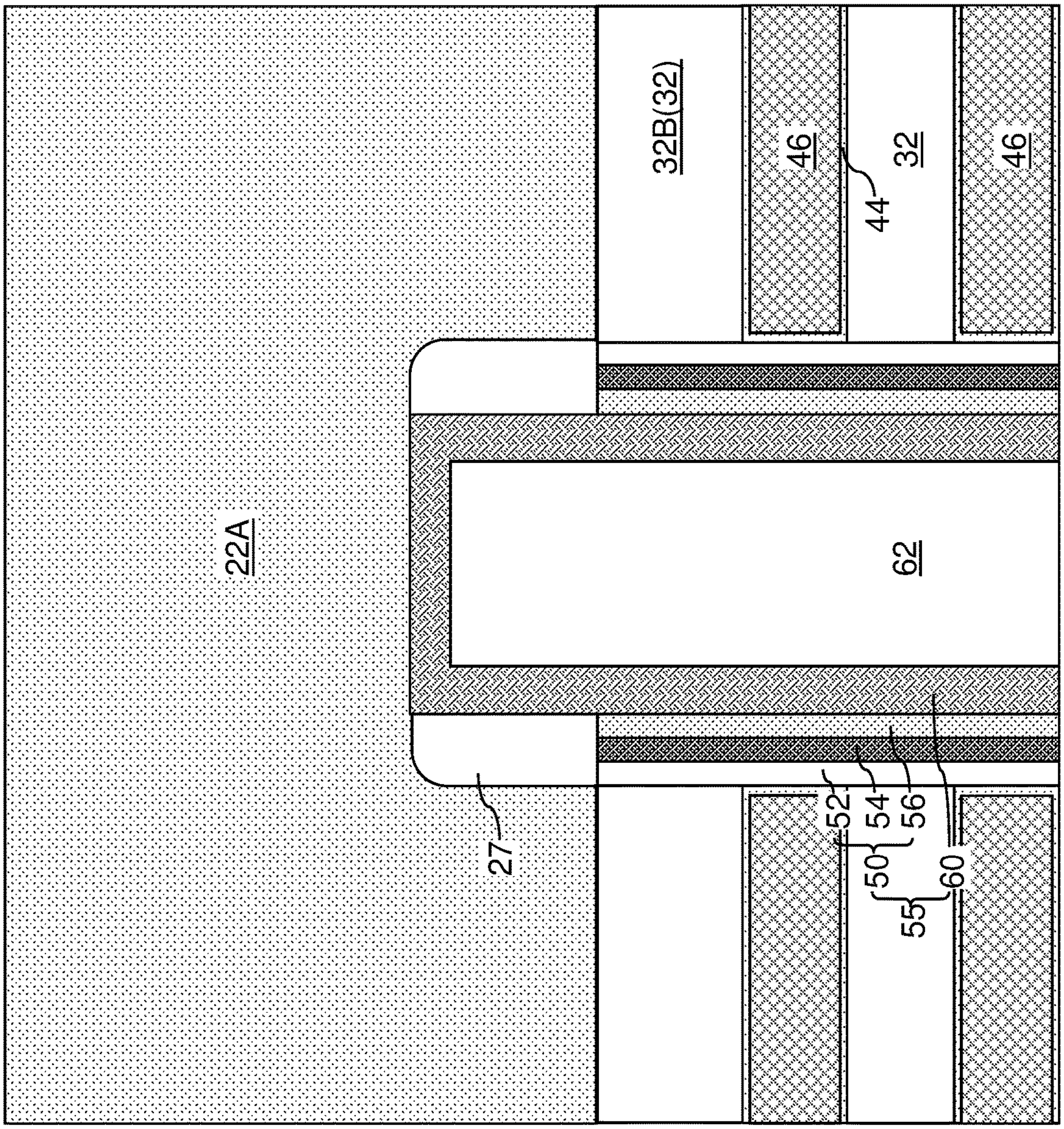

Referring to FIG. 18B, the processing steps described with reference to FIG. 17B can be performed to deposit the amorphous germanium-containing semiconductor layer 22A over the diffusion barrier 27.

Figure 18C:
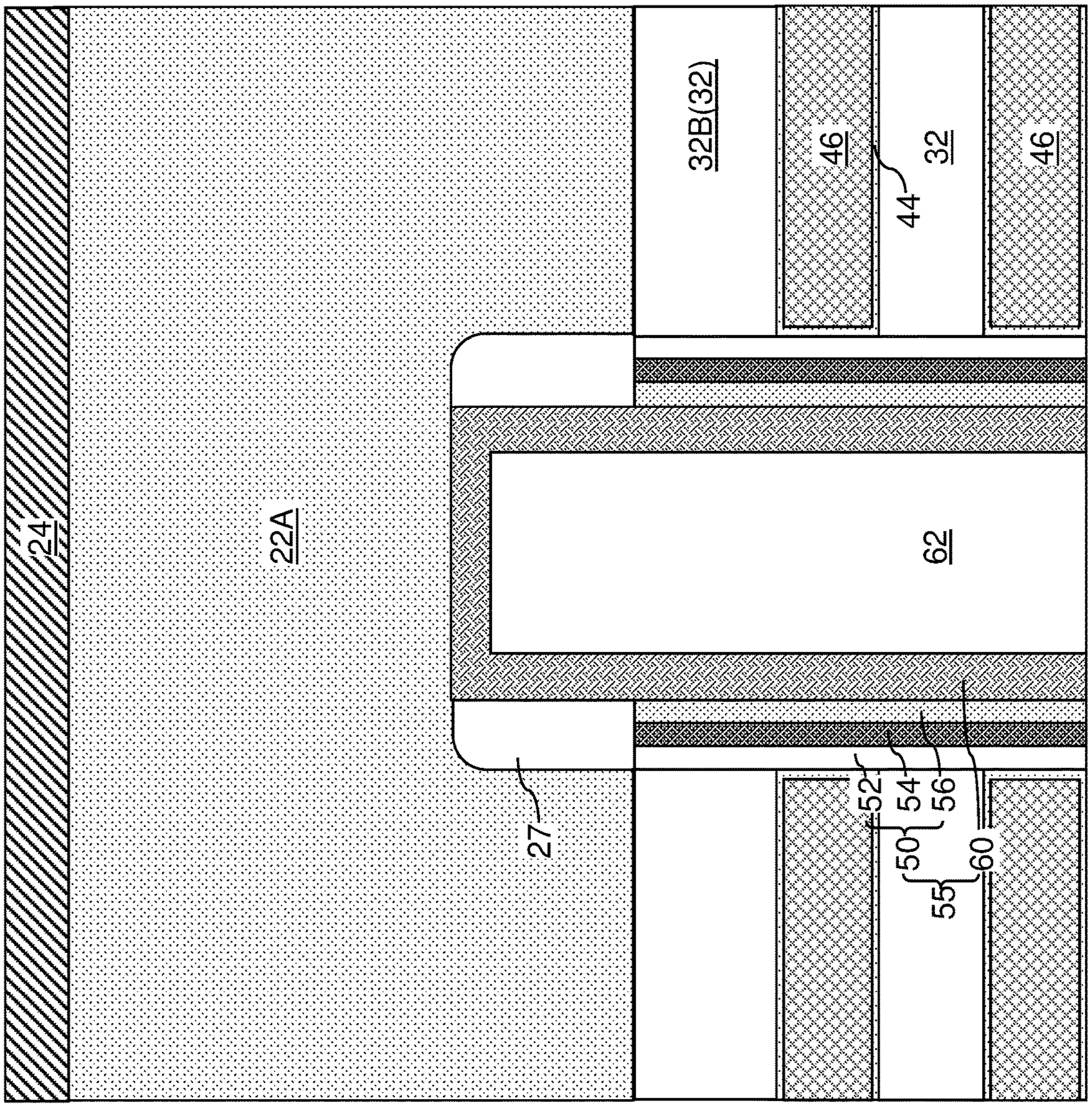

Referring to FIG. 18C, the processing steps described with reference to FIG. 17C can be performed to deposit the metal containing layer 24.

Figure 18D:
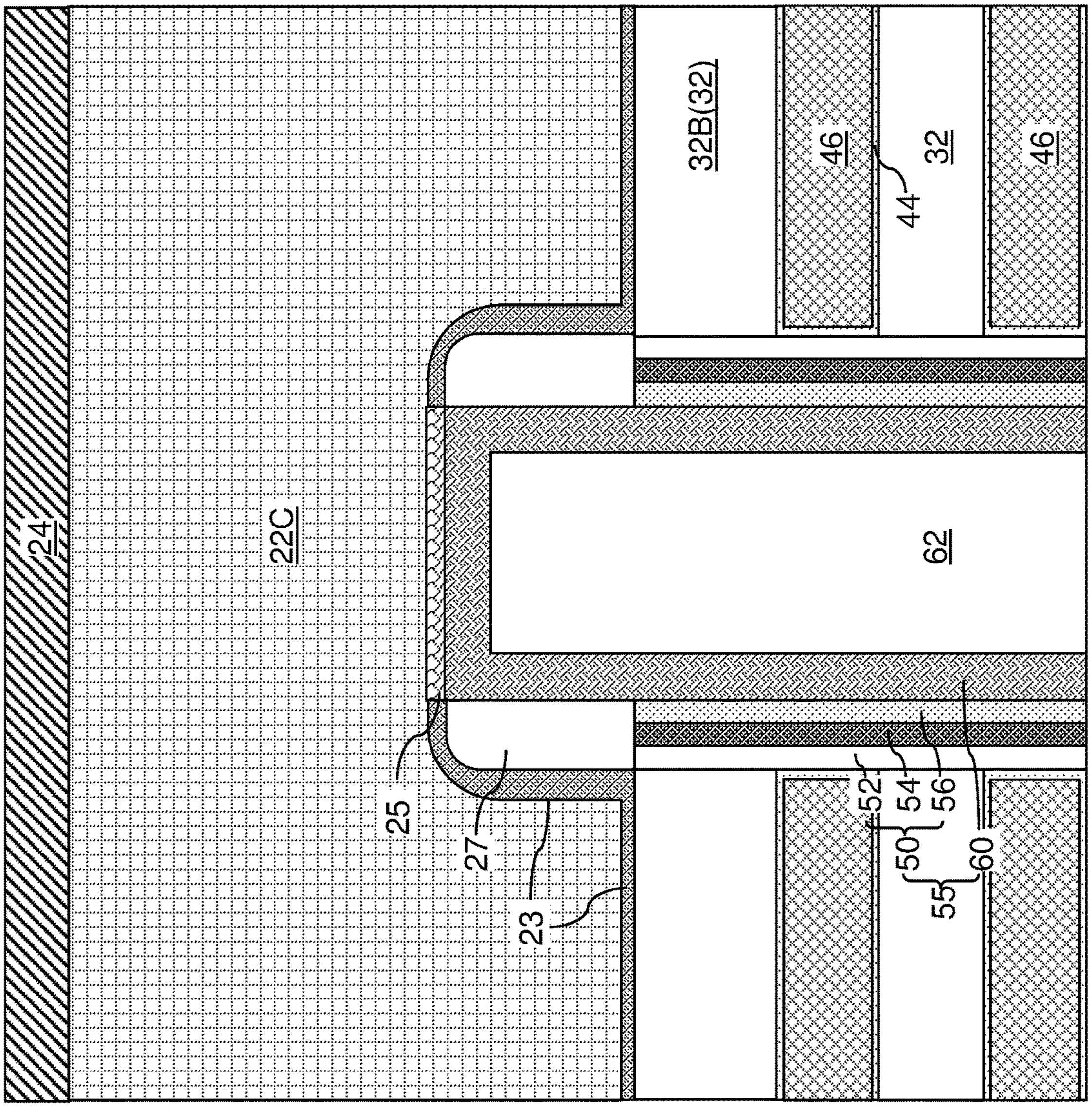

Referring to FIG. 18D, the processing steps described with reference to FIG. 17D can be performed to convert the amorphous germanium-containing semiconductor layer 22A into the polycrystalline germanium-containing semiconductor layer 22C. The diffusion barrier 27 prevents or reduces metal diffusion from the metal containing layer 24 into the memory film 50 and the upper portions of the vertical semiconductor channel 60 located in the memory opening 49 at the levels of the electrically conductive layers 46.

The interfacial metal alloy layer 23 can be formed between the polycrystalline germanium-containing semiconductor layer 22C and the alternating stack (32, 46) and on the outer surface of the diffusion barrier 27. The metal-silicon-germanium alloy layer 25 is formed on the bottom (i.e., horizontal) surface of the vertical semiconductor channel 60.

Figure 18E:
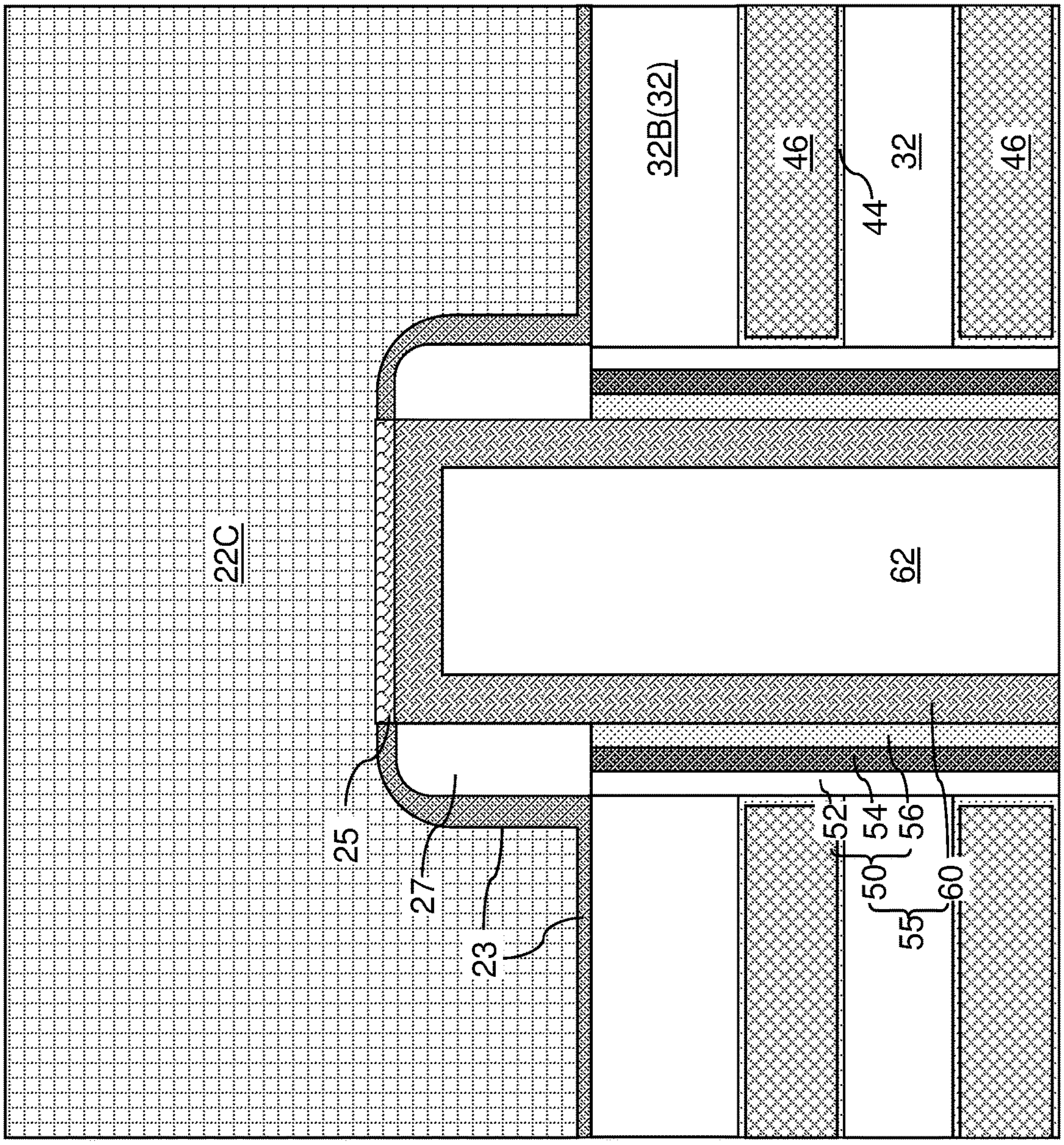

Referring to FIG. 18E, the processing steps described with reference to FIG. 17E can be performed remove remaining portions of the metal containing layer 24 selective to the polycrystalline germanium-containing semiconductor layer 22C.

Figure 19:
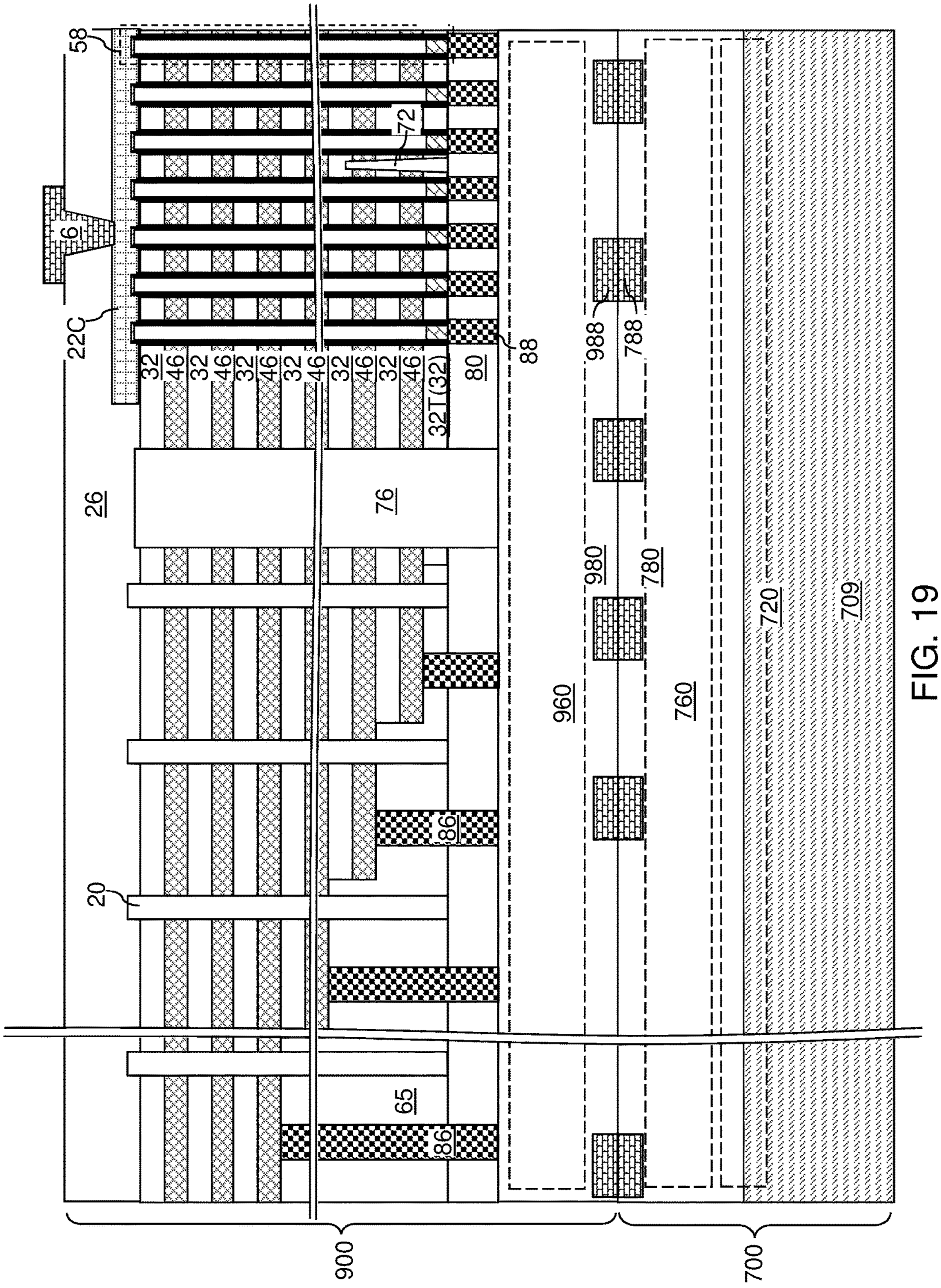
FIG. 19 is a vertical cross-sectional view of the exemplary structure after formation of a source contact structure according to the first or the second embodiments of the present disclosure.

Referring to FIG. 19, the polycrystalline germanium-containing semiconductor layer 22C may optionally be patterned, for example, to electrically isolate multiple memory blocks from each other or from other components within the memory die 900. A backside dielectric material layer 26 can be subsequently deposited over the polycrystalline germanium-containing semiconductor layer 22C. At least one electrically conductive source contact structure 6 can be subsequently formed through the backside dielectric material layer 26 to physically and/or electrically contact the polycrystalline germanium-containing semiconductor layer 22C. Thus, the polycrystalline germanium-containing semiconductor layer 22C functions as a source line of the memory device.

Referring to all drawings and according to various embodiments of the present disclosure, a memory device includes a polycrystalline germanium-containing semiconductor source line layer 22C containing germanium at an atomic percentage greater than 50%, an alternating stack of insulating layers 32 and electrically conductive layers 46 located over the polycrystalline germanium-containing semiconductor source line layer 22C, a memory opening 49 vertically extending through the alternating stack, a memory opening fill structure 58 located in the memory opening 49 and including a memory film 50 and a vertical semiconductor channel 60 having an end surface in electrical contact with the polycrystalline germanium-containing semiconductor source line layer 22C, and an interfacial metal alloy layer 23 located between the polycrystalline germanium-containing semiconductor source line layer 22 and a bottommost insulating layer 32B within the alternating stack (32, 46).

In one embodiment, the interfacial metal alloy layer 23 has an average thickness that is less than a thickness of a monolayer of the metal and includes nanoscale openings therethrough. In one embodiment, the memory film 50 is in contact with the interfacial metal alloy layer 23.

In one embodiment, the vertical semiconductor channel 60 comprises silicon at an atomic percentage greater than 90%; and a metal-silicon-germanium alloy layer 25 is present between the polycrystalline germanium-containing semiconductor layer 22C and the vertical semiconductor channel 60. In one embodiment, the metal-silicon-germanium alloy layer 25 has a thickness that is less than 20% of a maximum thickness of the vertical semiconductor channel 60. In one embodiment, the metal-silicon-germanium alloy layer 25 comprises a metal germanosilicide.

In the first embodiment, the vertical semiconductor channel 60 comprises an outer sidewall that includes a first cylindrical surface segment that contacts a cylindrical surface segment of the metal-silicon-germanium alloy layer 25 and a second cylindrical surface segment that contacts the memory film 50.

In the second embodiment, a diffusion barrier 27 is located between the memory film 50 and the interfacial metal alloy layer 23. In the second embodiment, the vertical semiconductor channel 60 comprises the outer sidewall having a portion that contacts the diffusion barrier 27 and a horizontal surface that contacts the metal-silicon-germanium alloy layer 25.

In one embodiment, a predominant fraction of grains within the polycrystalline germanium-containing semiconductor layer 22C comprises columnar grains that extend along the vertical direction from a bottommost surface of the polycrystalline germanium-containing semiconductor layer 22C to a top surface of the polycrystalline germanium-containing semiconductor layer 22C.

In one embodiment, the polycrystalline germanium-containing semiconductor layer 22C comprises atoms of an electrical dopant at an atomic concentration an atomic concentration in a range from $5.0\times10^{19}/cm^3$ to $2.0\times10^{21}/cm^3$. In one embodiment, the interfacial metal alloy layer 23 comprises a germanide or a germanosilicide of Au, In, Bi, Pb, Ga, Ag, Al, Sn, Zn, Sb, Fe, Nb, Mg, Mn, Co, Cr, Mo, Zr, Cu, Ni, Pd, Ta, Ti, or W.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Whenever two or more elements are listed as alternatives in a same paragraph of in different paragraphs, a Markush group including a listing of the two or more elements is also impliedly disclosed. Whenever the auxiliary verb "can" is employed in this disclosure to describe formation of an element or performance of a processing step, an embodiment in which such an element or such a processing step is not performed is also expressly contemplated, provided that the resulting apparatus or device can provide an equivalent result. As such, the auxiliary verb "can" as applied to formation of an element or performance of a processing step should also be interpreted as "may" or as "may, or may not" whenever omission of formation of such an element or such a processing step is capable of providing the same result or equivalent results, the equivalent results including somewhat superior results and somewhat inferior results. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. If publications, patent applications, and/or patents are cited herein, each of such documents is incorporated herein by reference in their entirety.

What is claimed is:

1. A method of forming a memory device, comprising:

forming an alternating stack of insulating layers and spacer material layers over a carrier substrate, wherein the spacer material layers are formed as or are subsequently replaced with electrically conductive layers;

forming a memory opening through the alternating stack;

forming a memory opening fill structure in the memory opening, wherein the memory opening fill structure comprises a memory film and a vertical semiconductor channel;

removing the carrier substrate;

removing an end portion of the memory film to physically expose an end portion of the vertical semiconductor channel;

depositing an amorphous germanium-containing semiconductor layer on a bottom surface of the alternating stack and on the physically exposed end portion of the vertical semiconductor channel;

depositing a metal containing layer comprising a metal on the amorphous germanium-containing semiconductor layer; and converting the amorphous germanium-containing semiconductor layer into a polycrystalline germanium-containing semiconductor source line layer using metal-induced crystallization by diffusing metal atoms from the metal containing layer through the amorphous germanium-containing semiconductor layer.

2. The method of claim 1, further comprising implanting electrical dopants into the amorphous germanium-containing semiconductor layer such that an atomic concentration the electrical dopants in the amorphous germanium-containing semiconductor layer is in a range from $5.0\times10^{19}/cm^3$ to $2.0\times10^{21}/cm^3$.

3. The method of claim 1, further comprising implanting electrical dopants into the crystalline germanium-containing semiconductor source line layer such that an atomic concentration the electrical dopants in the crystalline germanium-containing semiconductor source line layer is in a range from $5.0\times10^{19}/cm^3$ to $2.0\times10^{21}/cm^3$.

4. The method of claim 1, wherein the polycrystalline germanium-containing semiconductor source line layer comprises columnar grains that extend along a vertical direction from a bottommost surface of the polycrystalline germanium-containing semiconductor source line layer to a top surface of the polycrystalline germanium-containing semiconductor source line layer.

5. The method of claim 1, wherein an interfacial metal alloy layer is formed between the polycrystalline germanium-containing semiconductor source line layer and the alternating stack.

6. The method of claim 5, wherein:

the metal containing layer comprises Au, In, Bi, Pb, Ga, Ag, Al, Sn, Zn, Sb, Fe, Nb, Mg, Mn, Co, Cr, Mo, Zr, Cu, Ni, Pd, Ta, Ti, W, an alloy thereof, a silicide thereof or a germanide thereof;

the metal atoms comprise Au, In, Bi, Pb, Ga, Ag, Al, Sn, Zn, Sb, Fe, Nb, Mg, Mn, Co, Cr, Mo, Zr, Cu, Ni, Pd, Ta, Ti, or W; and the interfacial metal alloy layer comprises a germanide or a germanosilicide of Au, In, Bi, Pb, Ga, Ag, Al, Sn, Zn, Sb, Fe, Nb, Mg, Mn, Co, Cr, Mo, Zr, Cu, Ni, Pd, Ta, Ti, or W.

7. The method of claim 5, wherein the polycrystalline germanium-containing semiconductor source line layer comprises germanium at an atomic percentage greater than 50%.

8. The method of claim 7, wherein:

the vertical semiconductor channel comprises silicon at an atomic percentage greater than 90%; and a metal-silicon-germanium alloy layer is formed between the polycrystalline germanium-containing semiconductor source line layer and the vertical semiconductor channel.

9. The method of claim 8, further comprising forming a diffusion barrier between the memory film and the interfacial metal alloy layer.

10. The method of claim 9, wherein the vertical semiconductor channel comprises an outer sidewall having a portion that contacts the diffusion barrier and a horizontal surface that contacts the metal-silicon-germanium alloy layer.

* * * * *